(12) United States Patent
Ishizaki et al.

(10) Patent No.: US 8,891,413 B2
(45) Date of Patent: Nov. 18, 2014

(54) RADIO COMMUNICATION SYSTEM, RADIO COMMUNICATION METHOD, AND DATA TRANSMITTER

(75) Inventors: Haruya Ishizaki, Kawasaki (JP); Masayuki Mizuno, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 105 days.

(21) Appl. No.: 13/566,107

(22) Filed: Aug. 3, 2012

(65) Prior Publication Data

US 2013/0058263 A1    Mar. 7, 2013

(30) Foreign Application Priority Data

Sep. 6, 2011    (JP) .................. 2011-194265

(51) Int. Cl.
*H04L 5/14*    (2006.01)
*H04W 4/00*    (2009.01)

(52) U.S. Cl.
CPC .................... *H04W 4/008* (2013.01)
USPC ............................................. 370/278

(58) Field of Classification Search
USPC ......................... 370/278, 277, 276
See application file for complete search history.

(56) References Cited

U.S. PATENT DOCUMENTS

| | | | |
|---|---|---|---|
| 2002/0173270 A1* | 11/2002 | Buer | 455/13.4 |
| 2003/0134591 A1* | 7/2003 | Roberts et al. | 455/3.06 |
| 2005/0099269 A1 | 5/2005 | Diorio et al. | |
| 2005/0105239 A1* | 5/2005 | Satoh et al. | 361/139 |
| 2005/0156711 A1 | 7/2005 | Aljadeff et al. | |
| 2008/0100527 A1* | 5/2008 | Rahim | 343/867 |
| 2008/0231449 A1 | 9/2008 | Moshfeghi | |
| 2009/0186645 A1* | 7/2009 | Jaturong et al. | 455/507 |
| 2010/0052248 A1* | 3/2010 | Fushimi | 271/227 |
| 2012/0142280 A1* | 6/2012 | Banu et al. | 455/69 |

FOREIGN PATENT DOCUMENTS

JP    7-141577 A    6/1995

OTHER PUBLICATIONS

Hiroyuki Nakamoto et al., "A Passive UHF RFID Tag LSI with 36.6% Efficiency CMOS-Only Rectifier and Current-Mode Demodulator in 0.35μm FeRam Technology", IEEE International Solid-State Circuits Conference, Feb. 7, 2006, Session 17.
European Search Report mailed Feb. 4, 2013 for corresponding European Patent Application 12181978.3.

* cited by examiner

*Primary Examiner* — Andrew Lai
*Assistant Examiner* — Zhiren Qin
(74) *Attorney, Agent, or Firm* — Sughrue Mion, PLLC

(57) ABSTRACT

Disclosed is a radio communication system capable of reducing the cost for introducing a system utilizing RFID technology into a radio network environment. A radio communication system pertaining to the present invention includes a first radio equipment that transmits first data using a first radio wave; a data transmitter that outputs a second radio wave generated by modulating the first radio wave depending on second data which is an object for transmission; and a second radio equipment that receives the first and second radio waves and includes a separation and demodulation circuit that separates and demodulates the first data transmitted from the first radio equipment and the second data transmitted from the data transmitter included in the received radio waves. The data transmitter includes an amplifier for generating the second radio wave by amplifying the first radio wave.

31 Claims, 35 Drawing Sheets

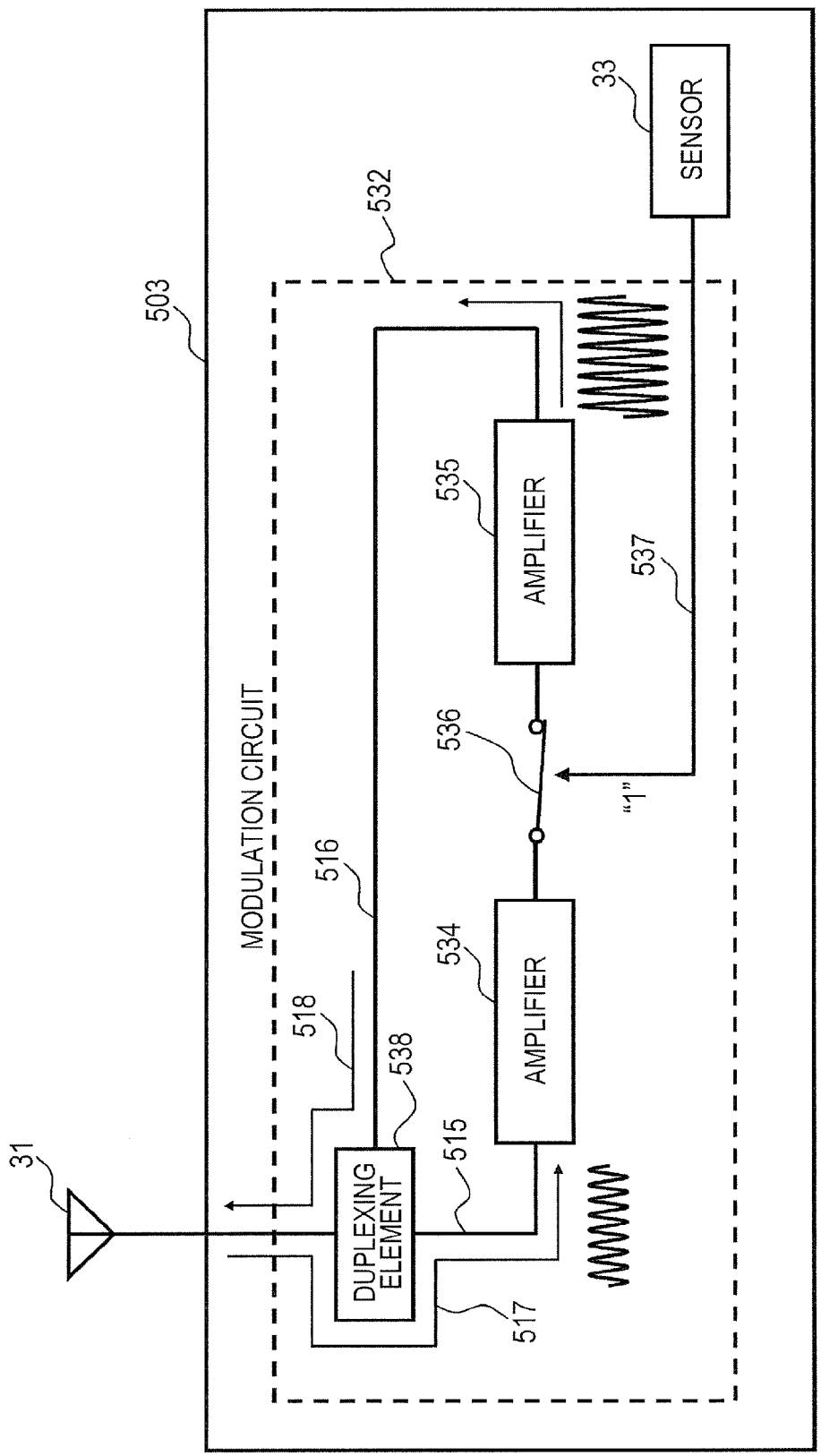

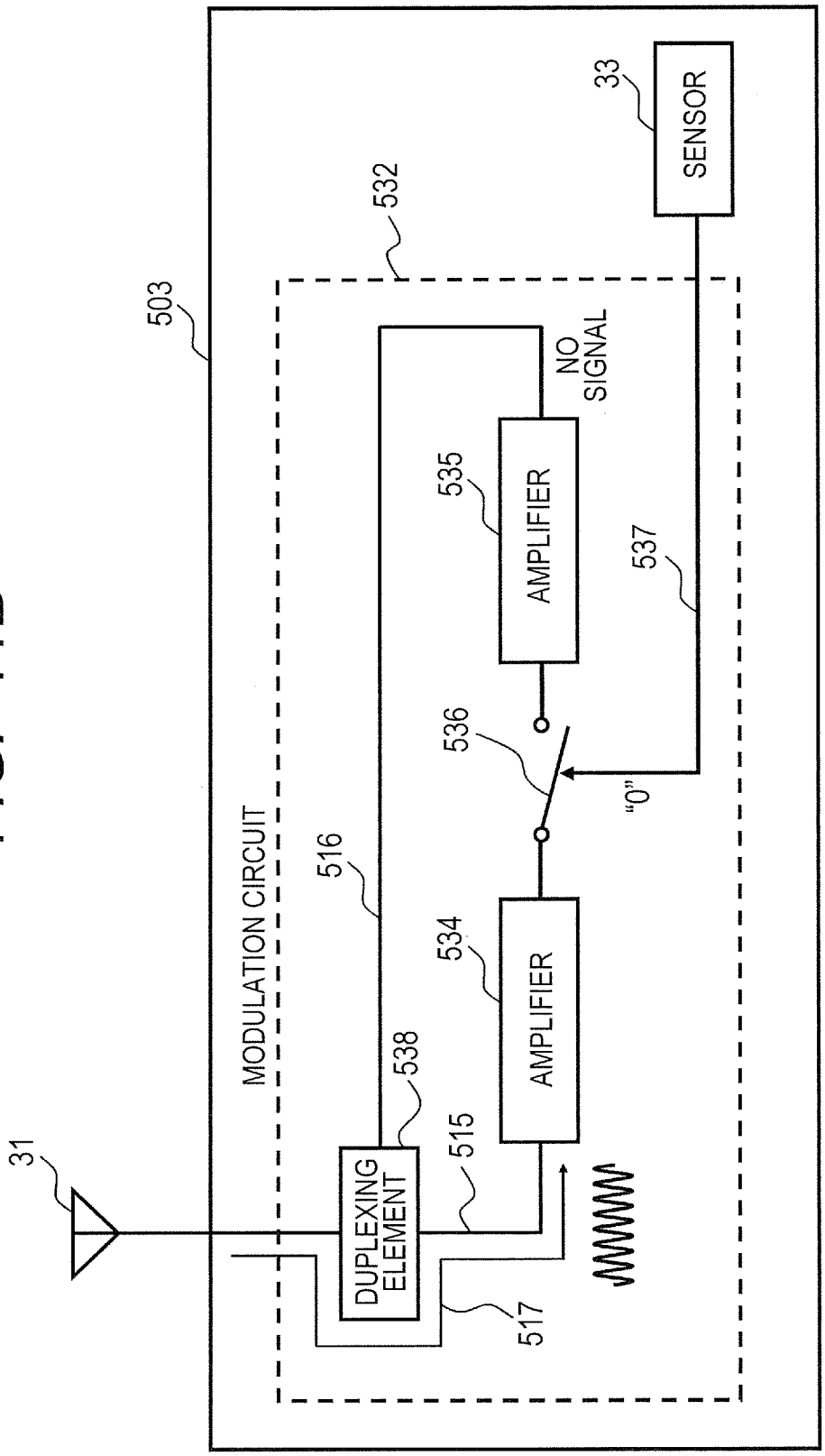

RADIO COMMUNICATION SYSTEM, RADIO COMMUNICATION METHOD, AND DATA TRANSMITTER

CROSS-REFERENCE TO RELATED APPLICATIONS

The disclosure of Japanese Patent Application No. 2011-194265 filed on Sep. 6, 2011 including the specification, drawings and abstract is incorporated herein by reference in its entirety.

BACKGROUND

The present invention relates to a radio communication system and method and, particularly, to a radio communication system and method making it possible to introduce a system utilizing RFID (Radio Frequency IDentification) technology into a radio network environment.

Lately, systems utilizing RFID attract attention and have begun to be applied for various uses. A basic configuration of a system using RFID includes an RFID reader/writer that performs data communication with an RFID radio tag via radio and a computer terminal that controls the RFID reader/writer. The RFID reader/writer can read data stored on the radio tag or write data into the radio tag (see Non-patent Document 1).

An RFID radio tag does not have a built-in battery, since it generates a power supply voltage using radio waves when transmitting and receiving data to and from the RFID reader/writer. Such a radio tag is generally called "passive-type". Specifically, in the RFID radio tag, a radio wave (a part of a carrier) supplied from the RFID reader/writer is rectified from AC to DC by a full-wave rectifier. The DC voltage is stepped up or down to a suitable voltage as a circuit power supply by an internal voltage control circuit or a booster circuit, and then the power is supplied as a power supply to internal circuits such as a current mode demodulator and a logic circuit. In this case, the efficiency of AC to DC conversion in the RFID radio tag can be enhanced by optimizing the size of a PMOS/NMOS rectifying diode included in the full-wave rectifier or reducing a loss due to parasitic capacitance or the like before input to the rectifying diode and a loss due to mismatch between an antenna and an input of the rectifier.

A technology concerning an indoor intruder detection apparatus is disclosed in Patent Document 1. The indoor intruder detection apparatus disclosed therein includes a transmitting device, a receiving device, and an alarm device. The transmitting device transmits an unmodulated radio signal with a given carrier frequency. The receiving device includes a receiving unit that receives a signal output from the transmitting device, a detecting unit that detects the received signal, and a level fluctuation detecting unit that outputs a detection signal when the level of the detected signal exceeds a predetermined range. The alarm device sounds an alarm based on the detection signal output from the level fluctuation detecting unit of the receiving device. The indoor intruder detection apparatus disclosed in Patent Document 1 detects an indoor intruder based on a fluctuation in the received electric field of radio waves output from the transmitting device and a fluctuation in the bit error rate of demodulated signals.

PATENT DOCUMENT 1

Japanese Unexamined Patent Application Publication No. Hei7 (1995)-141577

NON-PATENT DOCUMENT 1

International Solid-State Circuits Conferences 2006 Proceedings, Lecture No. 17.2

SUMMARY

As described in the Background section, in order to read data stored in an RFID radio tag (which is also referred to as a data transmitter), a special RFID reader/writer is required. Therefore, in order to read data stored in an RFID radio tag under a radio network (WLAN) environment, for example, a special RFID reader/writer wired to or wirelessly connected the radio network is required. Consequently, a problem lies in that it takes cost to introduce a system utilizing RFID technology into a radio network environment.

According to one aspect of the present invention, a radio communication system includes a first radio equipment that transmits first data using a first radio wave; a data transmitter that outputs a second radio wave generated by modulating the first radio wave depending on second data which is an object for transmission; and a second radio equipment that receives the first and second radio waves and includes a separation and demodulation circuit that separates and demodulates the first data transmitted from the first radio equipment and the second data transmitted from the data transmitter included in the received radio waves. The data transmitter includes an amplifier for generating a second signal by amplifying a first signal corresponding to the first radio wave, depending on the second data, and outputs the second signal as the second radio wave.

According to another aspect of the present invention, a radio communication method is used to transmit second data by a data transmitter over a radio network including a first radio equipment that transmits first data and a second radio equipment that receives the first data. The radio communication method includes the steps of: transmitting the first data from the first radio equipment using a first radio wave; at the data transmitter, modulating the first radio wave depending on the second data, thus generating a second radio wave, and outputting the second radio wave; and, at the second radio equipment, receiving the first and second radio waves and separating and demodulating the first data transmitted from the first radio equipment and the second data transmitted from the data transmitter included in the received radio waves. The step of generating and outputting the second radio wave at the data transmitter includes amplifying a first signal corresponding to the first radio wave depending on the second data, thus generating a second signal, and outputting the second signal as the second radio wave.

In the radio communication system and method according to another aspect of the present invention, the data transmitter modulates the first radio wave depending on second data which is an object for transmission and outputs the modulated radio wave as the second radio wave. The thus modulated second radio wave acts as a disturbance to the first radio wave. Then, the second radio equipment separates the first data transmitted from the first radio equipment and the second data transmitted from the data transmitter by exploiting the presence or absence of a disturbance to the first radio wave 12 and demodulates the first and second data. Thus, because there is no need for providing a special RFID reader/writer to read data stored on the data transmitter, it is possible to reduce the cost for introducing a system utilizing RFID technology into a radio network environment. Also, because the second radio wave yielded by amplifying the first radio wave is output from the data transmitter, the second data can be transmitted from the data transmitter to the second radio equipment even if there is some distance between the data transmitter and the second radio equipment.

According to a further aspect of the present invention, a data transmitter includes a modulation circuit that modulates a first radio wave being used in a radio network depending on transmission data which is an object for transmission, thereby generating a second radio wave that causes a disturbance to the first radio wave. The modulation circuit includes an amplifier for generating a second signal by amplifying a first signal corresponding to the first radio wave, depending on the transmission data, and outputs the second signal as the second radio wave.

According to the aspects of the present invention, it is possible to provide a radio communication system and method capable of reducing the cost for introducing a system utilizing RFID technology into a radio network environment.

BRIEF DESCRIPTION OF THE DRAWINGS

FIG. 11A is a diagram for explaining operation of the data transmitter shown in FIG. 10;

FIG. 11B is a diagram for explaining operation of the data transmitter shown in FIG. 10;

DETAILED DESCRIPTION

First Embodiment

Figure 1:
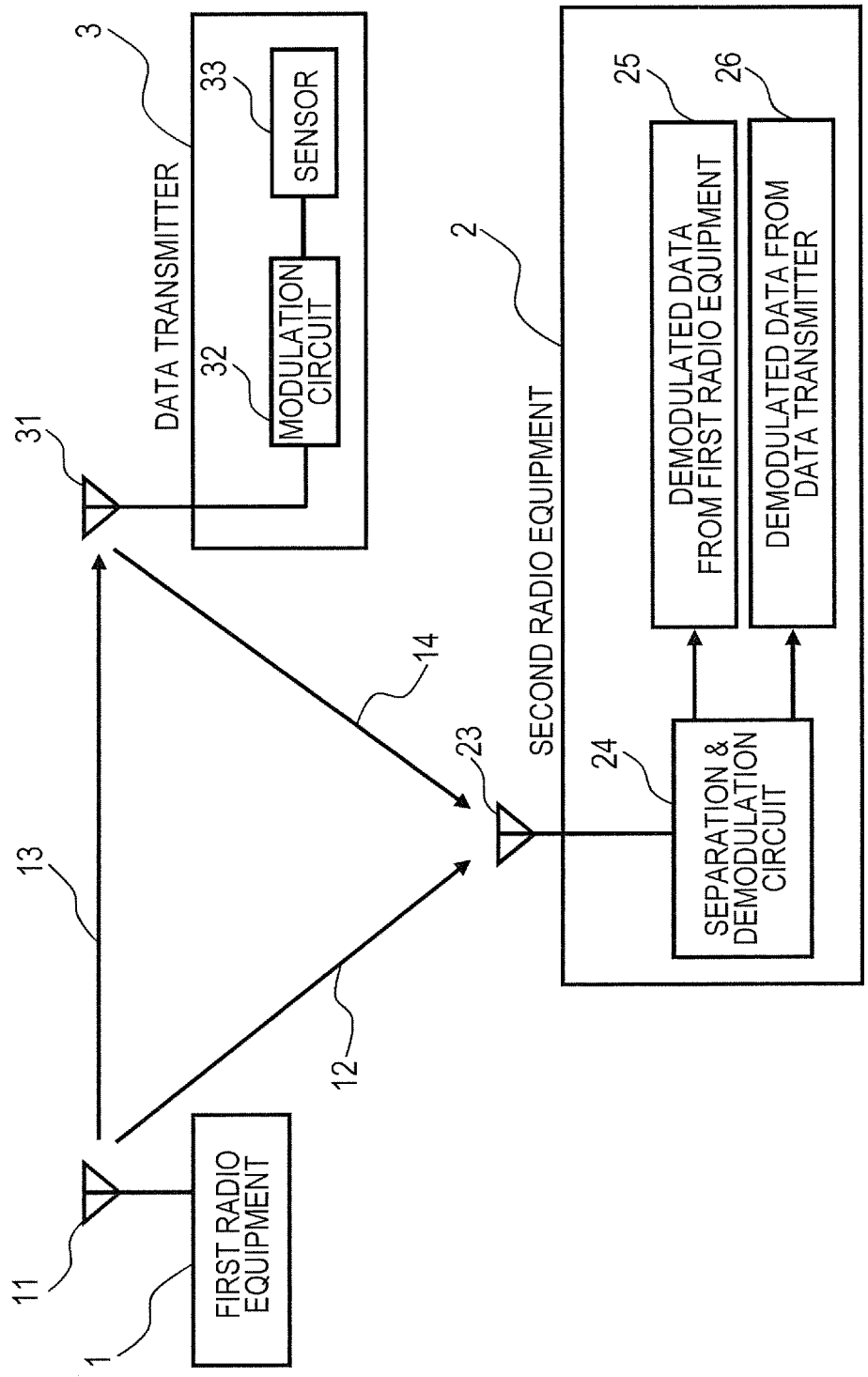
FIG. 1 is a block diagram representing a radio communication system pertaining to a first embodiment.

In the following, embodiments of the present invention will be described with reference to the drawings. FIG. 1 is a block diagram representing a radio communication system pertaining to a first embodiment. As shown in FIG. 1, the radio communication system pertaining to the first embodiment includes a first radio equipment 1, a second radio equipment 2, and a data transmitter (corresponding to an RFID radio tag) 3. The first radio equipment 1 transmits first data using first radio waves 12, 13. The data transmitter 3 modulates a first radio wave 13 depending on second data which is an object for transmission and thus generates and outputs a second radio wave 14. The second radio equipment 2 receives a first radio wave 12 and the second radio wave 14 and includes a separation and demodulation circuit 24 that separates and demodulates first data transmitted from the first radio equipment 1 and second data transmitted from the data transmitter 3 included in the received radio waves. A feature of the radio communication system pertaining to the present embodiment resides in that a disturbance from the data transmitter 3 such as an RFID tag, which was removed as noise in related art, can be isolated and extracted as data by the separation and demodulation circuit 24 of the second radio equipment 2. Each of the constituent elements of the radio communication system pertaining to the present embodiment will be detailed below.

The first radio equipment 1 includes internal circuitry (not shown) and an antenna 11 for implementing radio communication with the second radio equipment 2 and transmits first data using first radio waves 12, 13. Here, one first radio wave 12 is a direct radio wave that is directly transmitted to the second radio equipment 2. The other first radio wave 13 is received by the data transmitter 3.

The second radio equipment 2 includes internal circuitry (not shown) and an antenna 23 for implementing radio communication with the first radio equipment 1. The separation and demodulation circuit 24 provided in the second radio equipment 2 separates first data transmitted from the first radio equipment 1 and second data transmitted from the data transmitter 3 included in the received first and second radio waves. Further, the separation and demodulation circuit 24 demodulates the first data transmitted from the first radio equipment 1 and the second data transmitted from the data transmitter 3, respectively.

Here, the first radio equipment 1 and the second radio equipment 2 forms a radio network (WLAN). For example, it can be assumed that the first radio equipment 1 is a base station in WLAN (a parent node in WLAN) and the second radio equipment 2 is a receiver in WLAN (a child node in WLAN). Alternatively, for example, the first radio equipment 1 and the second radio equipment 2 may be configured to enable bidirectional communication. In the present embodiment, normal data communication between the first radio equipment 1 and the second radio equipment 2 is performed through the use of the internal circuitry included each of the first radio equipment 1 and the second radio equipment 2. Aspects of the normal data communication between the first radio equipment 1 and the second radio equipment 2 are the same as for related art and, therefore, detailed explanation thereof is here dispensed with.

The radio communication system pertaining to the present embodiment is not limited to WLAN and can also be widely applied to any equipment pursuant to existing radio standards such as Bluetooth (a registered trademark) and mobile or cellular phones, besides WLAN.

The data transmitter 3 includes an antenna 31, a modulation circuit 32, and a sensor 33. The data transmitter 3 receives a first radio wave 13 output from the first radio equipment 1, modulates the first radio wave 13 depending on second data which is an object for transmission by means of the modulation circuit 32, and thus generates and outputs a second radio wave 14. Here, the second data that is transmitted by the data transmitter 3 is, for example, data acquired with the sensor 33. The sensor 33 may be, for example, a temperature sensor which measures someone's temperature, a pressure sensor which measures someone's blood pressure, etc. For example, a data transmitter with a built-in temperature sensor is attached to a measurement subject and temperature information for the measurement subject is transmitted by radio and received over the radio network, so that the temperature of the measurement subject can be checked consecutively.

The sensor 33 is not limited to the temperature sensor or the pressure sensor and may be any sensor that is capable of acquiring intended data.

The modulation circuit 32 generates a second radio wave 14 by modulating the first radio wave 13 depending on second data which is an object for transmission. Here, for example, the modulation circuit 32 can generate a second radio wave 14 by load modulating the first radio wave depending on the second data which is an object for transmission. That is, the modulation circuit 32 coupled to the antenna 31 of the data transmitter 3 is configured with a load modulation circuit. By changing matching to the first radio wave 13 received by the antenna 31, data can be transmitted to the second radio equipment 2.

For example, impedance setting for the modulation circuit 32 is set such that an output impedance of the antenna 31 and an input impedance of the modulation circuit 32 match in a real part and the absolute values of both impedances match with sign inversion in an imaginary part. Then, the efficiency of power transfer from the antenna 31 to the inside of the data transmitter 3 is maximized and, ideally, radio wave received by the antenna 31 is not reflected again. In other words, the second radio wave is not output from the antenna 31.

On the other hand, when the above impedance setting with regard to the output impedance of the antenna 31 and the input impedance of the modulation circuit 32 is cleared, the first radio wave 13 which has been input from the antenna 31 is reflected by impedance mismatch. This reflected wave is radiated as the second radio wave 14.

Then, this reflected wave (second radio wave 14) acts as a disturbance to the first radio wave 12. Thus, by detecting whether this disturbance is present at the second radio equipment 2, binary data can be transmitted from the data transmitter 3 to the second radio equipment 2.

However, the load modulation as above is performed on the data transmitter 3 without being supplied with external power. Hence, it is impossible to transmit from the antenna 31 the second radio wave 14 with a strength larger than the strength of the first radio wave 13 received by the antenna 31. In other words, the reflected wave (second radio wave 14) reflected by impedance mismatch becomes weaker in strength than the first radio wave 13 received by the antenna 31. Therefore, in a case where a load modulation circuit is used as the modulation circuit 32, power consumption can be kept low, but there is a problem in which the communication distance between the data transmitter 3 and the second radio equipment 2 is restricted to a short distance.

Figure 2:
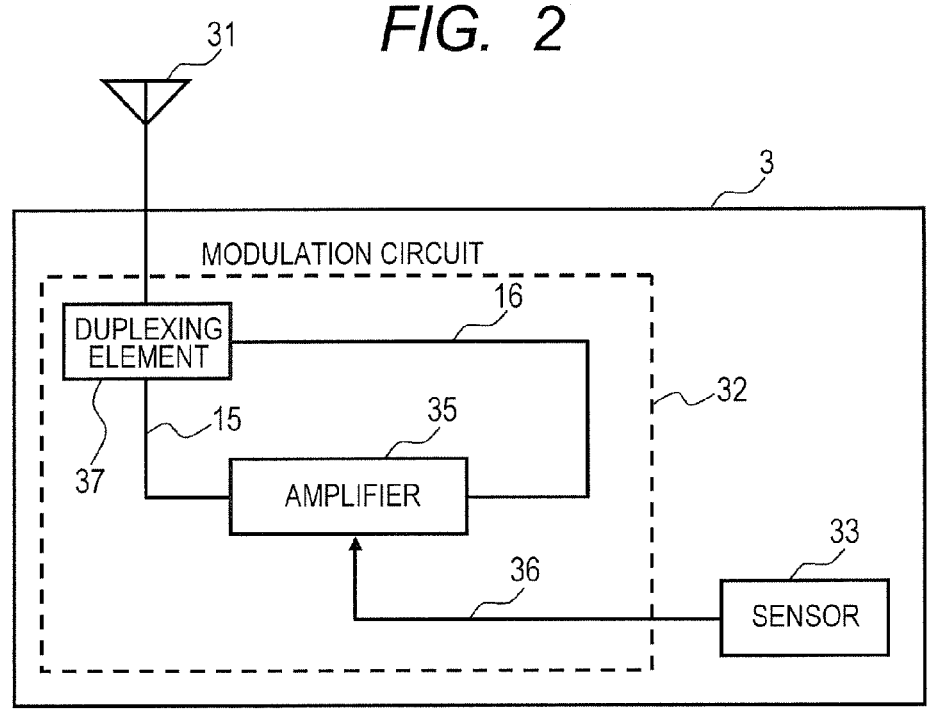
FIG. 2 is a block diagram representing a data transmitter for use in the radio communication system pertaining to the first embodiment.

In order to solve this problem, accordingly, a data transmitter 3 that is shown in FIG. 2 can be used as the data transmitter 3 in the radio communication system pertaining to the present embodiment. The data transmitter 3 shown in FIG. 2 includes an antenna 31, a modulation circuit 32, and a sensor 33. The modulation circuit 32 includes an amplifier (variable gain amplifier) 35 and a duplexing element 37. The modulation circuit 32 generates a second radio wave 14 by modulating the first radio wave 13 depending on second data which is an object for transmission.

In particular, the amplifier 35 provided in the modulation circuit 32 amplifies a first signal 15 corresponding to the first radio wave 13 received by the antenna 31, depending on second data, and thus generates a second signal 16. The generated second signal 16 is radiated as the second radio wave 14 from the antenna 31. The amplifier 35 is capable of changing its amplification factor according to a gain control signal 36. Here, a value of the gain control signal 36 corresponds to second data which is an object for transmission.

The duplexing element 37 has a function of separating a path 17 (see FIG. 3A) for inputting the first signal 15 corresponding to the first radio wave 13 received by the antenna 31 to the amplifier 35 and a path 18 (see FIG. 3A) for outputting the second signal 16 amplified by the amplifier 35 from the amplifier 35 to the antenna 31. As the duplexing element 37, for example, a directional coupler can be used. That is, the duplexing element 37 is configured to allow power transfer from the antenna 31 to the input of the amplifier 35 and power transfer from the output of the amplifier 35 to the antenna 31. In other words, the duplexing element 37 is configured such that it can close off power transfer from the output of the amplifier 35 to the input of the amplifier 35, power transfer from the input of the amplifier 35 to the output of the amplifier 35, power transfer from the input of the amplifier 35 to the antenna 31, and power transfer from the antenna 31 to the output of the amplifier 35.

Figure 3A:
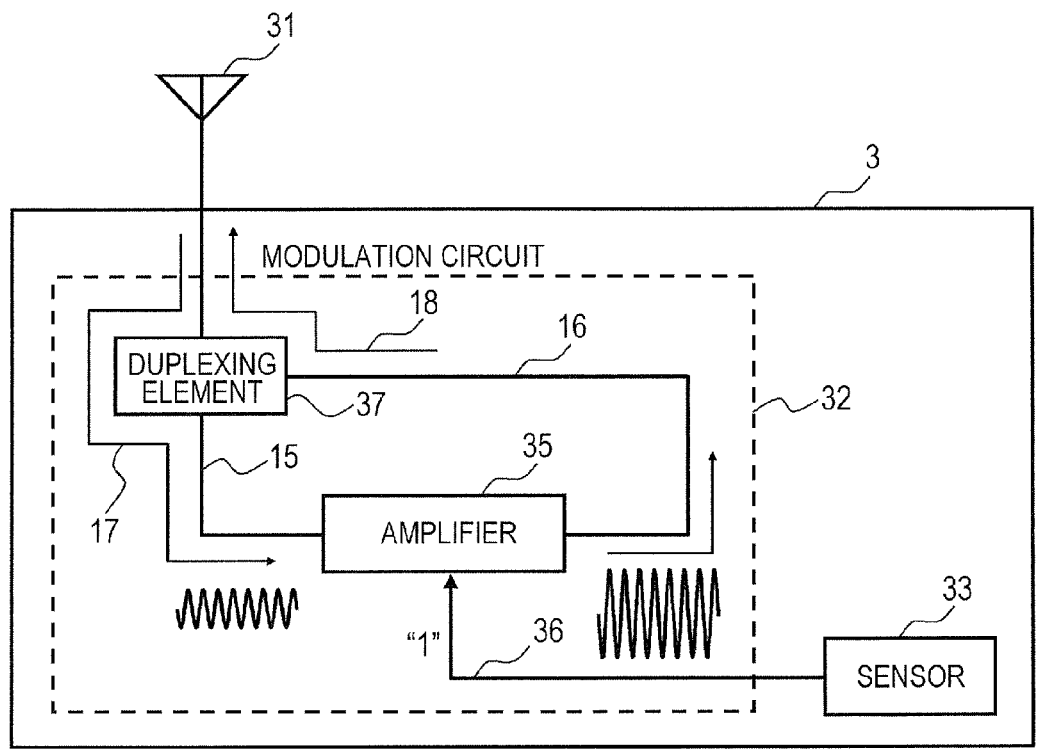
FIG. 3A is a diagram for explaining operation of the data transmitter shown in FIG. 2.

For example, as shown in FIG. 3A, if second data which is an object for transmission is "1" (i.e., the gain control signal 36 is "1" (active state)), the amplifier 35 amplifies the first signal 15 corresponding to the first radio wave 13 received by the antenna 31 and generates the second signal 16 with a larger amplitude. The generated second signal 16 is radiated from the antenna 31 as the second radio wave 14 which acts as a disturbance to the first radio wave 12. At this time, it is possible to output a stronger second radio wave 14 from the antenna 31 by increasing the amplification factor of the amplifier 35. In this way, data of "1" is transmitted from the data transmitter 3 to the second radio equipment 2.

Figure 3B:
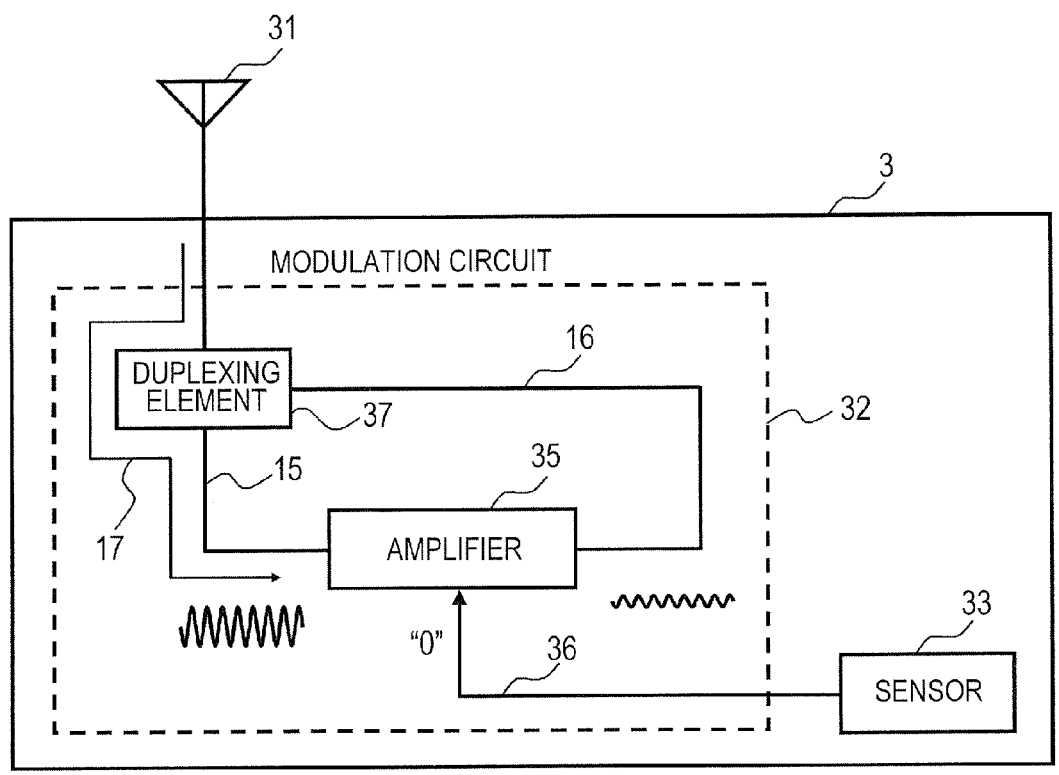
FIG. 3B is a diagram for explaining operation of the data transmitter shown in FIG. 2.

On the other hand, as shown in FIG. 3B, if second data which is an object for transmission is "0" (i.e., the gain control signal 36 is "0" (inactive state)), the amplifier 35 regulates the amplitude of the first signal 15 corresponding to the first radio wave 13 received by the antenna 31 to a sufficiently small amplitude. Thus, in this case, because the second signal 16 with a sufficiently small amplitude is output from the amplifier 35, the second radio wave 14 radiated from the antenna 31 does not act as a disturbance to the first radio wave 12. In this way, data of "0" is transmitted from the data transmitter 3 to the second radio equipment 2. If the gain control signal 36 is "0", the amplifier 35 may regulate the amplitude of the first signal 15 corresponding to the first radio wave 13 received by the antenna 31 to zero. At this time, no second signal 16 is output from the amplifier 35 and, thus, no second radio wave 14 is output from the antenna 31.

Figure 4:
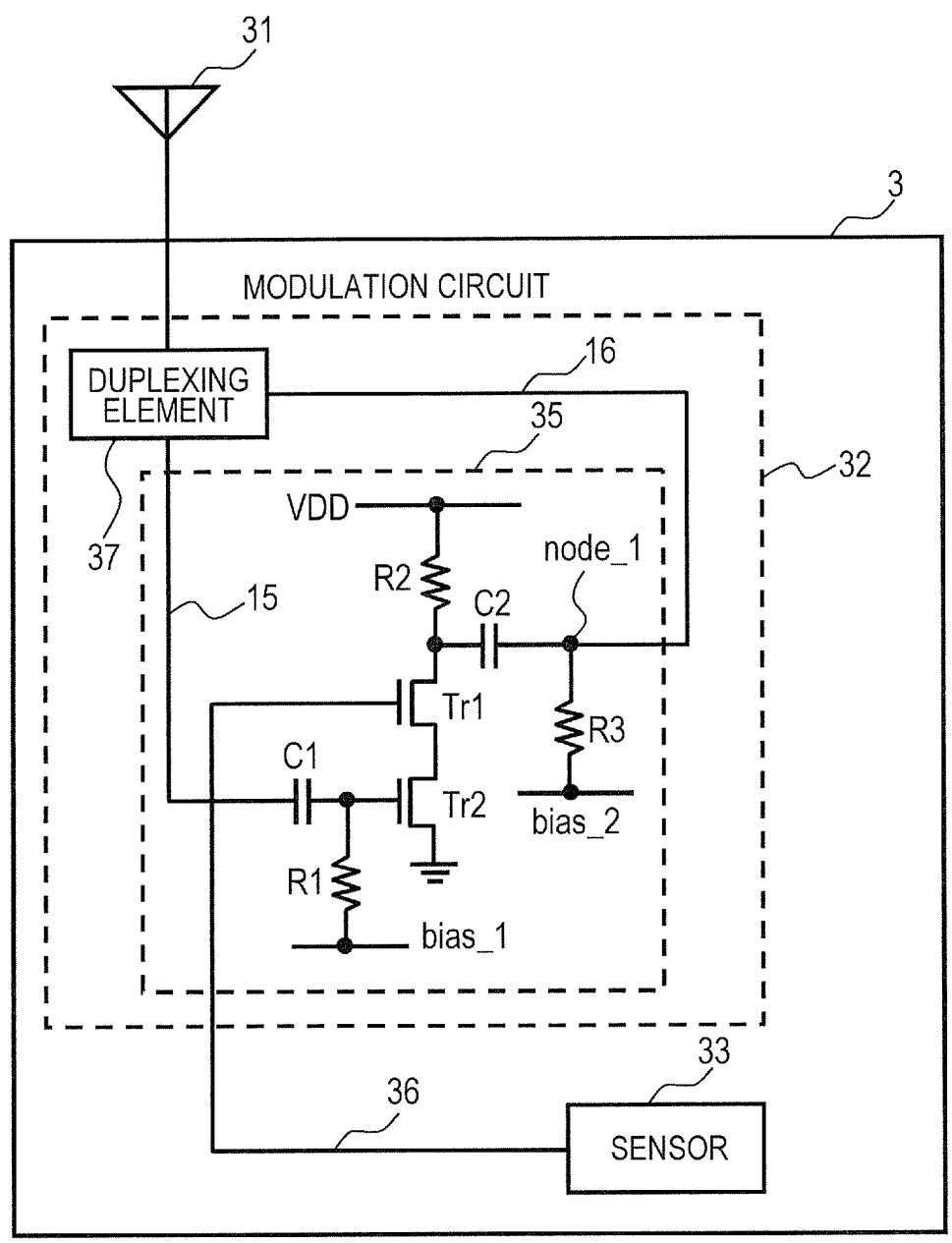
FIG. 4 is a circuit diagram showing a concrete example of the data transmitter shown in FIG. 2.

FIG. 4 is a circuit diagram representing a concrete example of the data transmitter 3 shown in FIG. 2. The data transmitter 3 shown in FIG. 4 is one example and, in the present embodiment, any data transmitter that can implement the operation described above can be used, not limited to the data transmitter shown in FIG. 4.

As shown in FIG. 4, the amplifier (single-end amplifier) 35 includes N-type transistors Tr1, Tr2, capacitors C1, C2, and resistors R1, R2, R3. To one end of a capacitor C1, the first signal 15 corresponding to the first radio wave 13 received by the antenna 31 is supplied. The other end of the capacitor C1 is coupled to one end of a resistor R1 and a gate of an N-type transistor Tr2. A bias voltage bias_1 is supplied to the other end of the resistor R1. A drain of the N-type transistor Tr2 is coupled to a source of an N-type transistor Tr1 and a source of the N-type transistor Tr2 is grounded.

The gain control signal 36 is supplied to a gate of the N-type transistor Tr1. A drain of the N-type transistor Tr1 is coupled to one end of a resistor R2 and one end of a capacitor C2. The other end of the resistor R2 is coupled to a power supply VDD. The other end of the capacitor C2 is coupled to one end of a resistor R3. A bias voltage bias_2 is supplied to the other end of the resistor R3. The second signal 16 amplified by the amplifier 35 is output from a node node_1 at which the other end of the capacitor C2 and the one end of the resistor R2 are coupled.

In the amplifier 35 shown in FIG. 4, if the gain control signal 36 is "0", the N-type transistor Tr1 is put in an off state and, thus, no amplified signal is output from the node node_1. On the other hand, if the gain control signal 36 is "1", the N-type transistor Tr1 is put in an on state. At this time, the first signal 15 increased as much as the bias voltage bias_1 is supplied to the gate of the N-type transistor Tr2. Thereby, the N-type transistor Tr2 operates in response to the first signal 15 and, thus, the second signal 16 yielded by amplifying the first signal 15 is output from the node node_1. The amplified signal is supplied via the duplexing element 37 to the antenna 31 and radiated as the second radio wave 14 from the antenna 31.

By using the data transmitter 3 equipped with the amplifier 35 described above, it is possible to transmit second data from the data transmitter 3 to the second radio equipment 2 even if there is some distance between the data transmitter 3 and the second radio equipment 2. For example, let us assume the following: the gain of the amplifier 35 is 10 dB, the communication distance between the data transmitter 3 and the second radio equipment 2 when the amplifier 35 is not used is r, the communication distance between the data transmitter 3 and the second radio equipment 2 when the amplifier 35 is used is r'. Besides, assuming that a difference between the attenuations by the respective communication distances is 10 dB and the attenuations by the distances are in accordance with a Friis transmission equation, the following equation can be derived.

$$20 \log(4\pi r'/\lambda) - 20 \log(4\pi r/\lambda) = 10 \qquad \text{Equation 1}$$

Hence, r'=3.2r is calculated from the above equation. In the case where the amplifier 35 is used in the modulation circuit 32, the communication distance between the data transmitter 3 and the second radio equipment 2 can be increased by a factor of 3.2.

Figure 5:
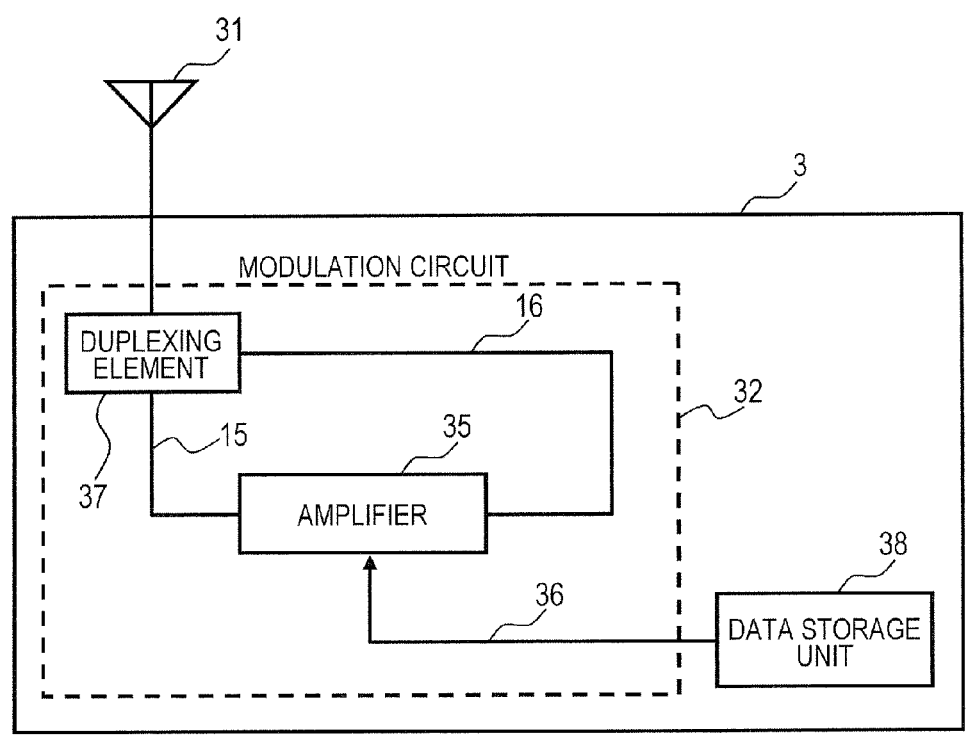
FIG. 5 is a block diagram showing another example of the data transmitter for use in the radio communication system pertaining to the first embodiment.
Figure 6:
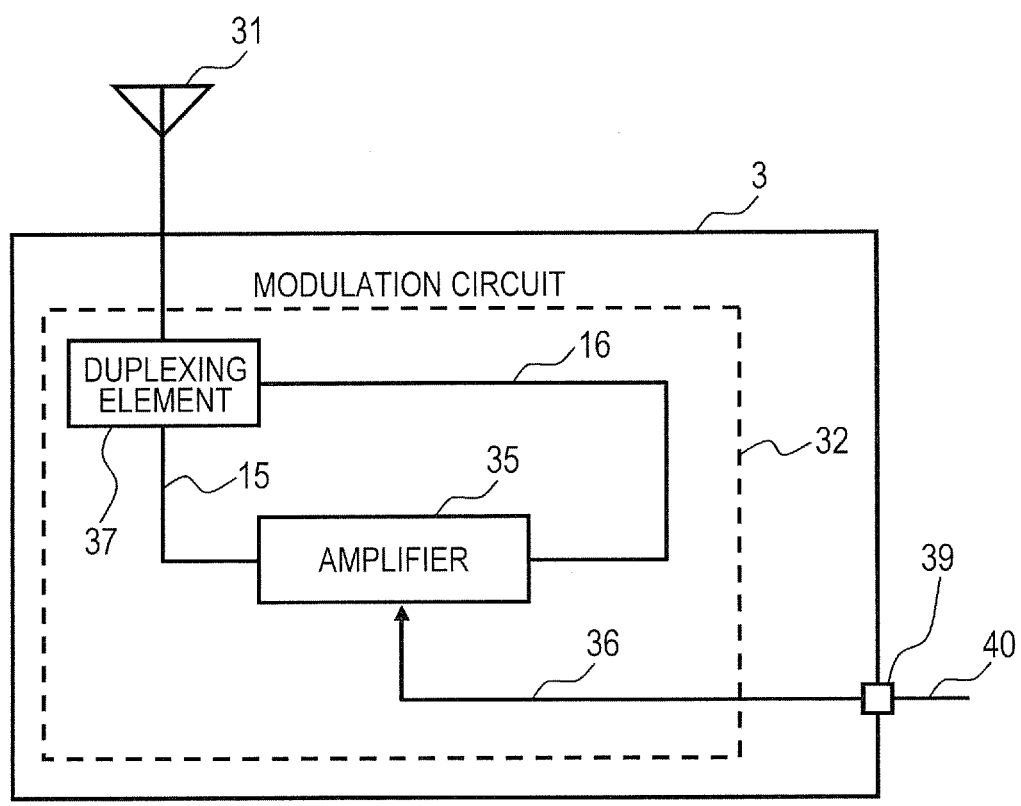
FIG. 6 is a block diagram showing yet another example of the data transmitter for use in the radio communication system pertaining to the first embodiment.

Second data that is transmitted by the data transmitter 3 may be data provided beforehand in the data transmitter 3. In this case, the data transmitter 3 does not need to include a sensor and can be configured including a data storage unit 38 for storing data, as shown in FIG. 5. Also, second data that is transmitted by the data transmitter 3 may be externally acquired data. In this case, the data transmitter 3 includes an input terminal 39, as shown in FIG. 6, and the data transmitter 3 can acquire external data 40 via the input terminal 39. Here, a value of the acquired external data 40 corresponds to the gain control signal 36.

Figure 8:
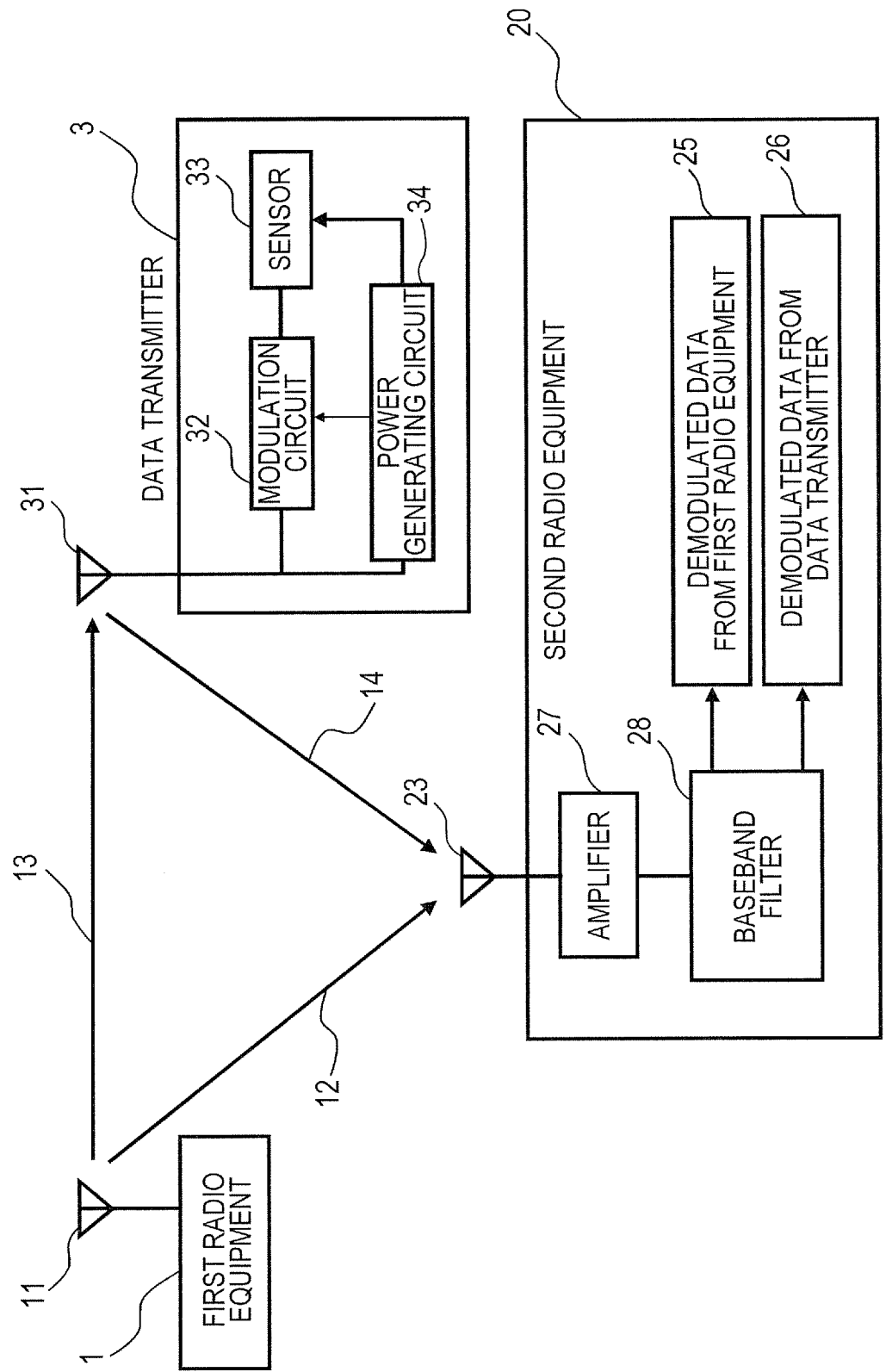
FIG. 8 is a block diagram showing another example of the radio communication system pertaining to the first embodiment.

The data transmitter 3 may include a power generating circuit 34 as in another example of the radio communication system pertaining to the present embodiment, which is shown in FIG. 8. That is, the power generating circuit 34 provided in a data transmitter 30 shown in FIG. 8 receives a first radio wave (environmental radio wave) 13 through an antenna 31 and rectifies the first radio wave (environmental radio wave) 13 from AC to DC by a full-wave rectifier. After the voltage of the resulting DC power is increased or decreased to a voltage suitable for a circuit power supply by using an internal voltage control circuit and a booster circuit, the power generating circuit 34 can supply this power to the modulation circuit 3, sensor 33, and other components. In this case, the data transmitter 30 does not need a battery installed therein and is configured as a so-called passive-type data transmitter. On the other hand, the data transmitter 3 may have a built-in battery and, in this case, it is configured as a so-called active-type data transmitter. In the case of the active type, the remaining amount of the battery may be included as second data that is transmitted by the data transmitter 3. In this case also, by providing the amplifier 35 in the modulation circuit 32, the communication distance between the data transmitter 3 and the second radio equipment 2 can further be extended.

Then, descriptions are provided for operation of the radio communication system pertaining to the present embodiment. The first radio equipment 1 and the second radio equipment 2 shown in FIG. 1 forms a radio network (WLAN). In particular, the first radio equipment 1 and the second radio equipment 2 are configured to enable communication using the first radio wave 12 having components modulated in accordance with a standard.

Figure 7:
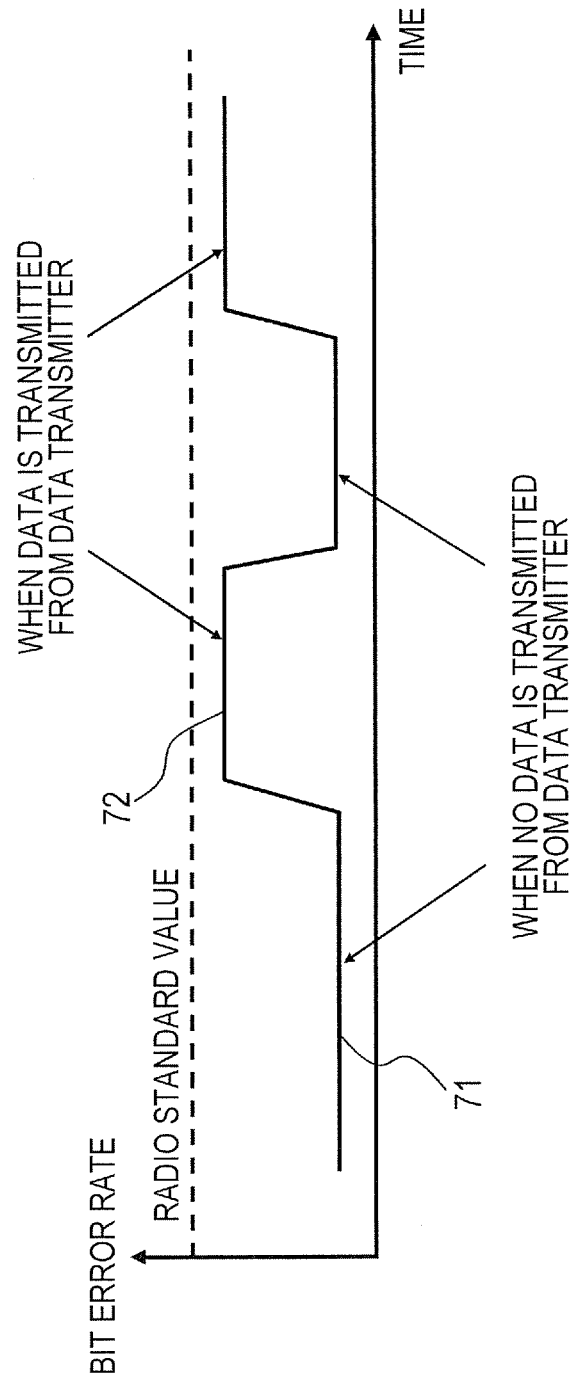
FIG. 7 is a diagram for explaining a bit error rate of radio waves that are received by a second radio equipment pertaining to the first embodiment.

FIG. 7 is a diagram for explaining a bit error rate of radio waves (the first radio wave 12 and second radio wave 14) that are received by the second radio equipment. If there is not data transmission from the data transmitter 3, the first radio wave 12 is not affected by the second radio wave 14 transmitted from the data transmitter 3. That is, in this case, the second radio wave 14 transmitted from the data transmitter 3 does not act as a disturbance to the first radio wave 12 and, thus, the bit error rate does not rise, as indicated by a reference numeral 71 in FIG. 7. Therefore, the first radio equipment 1 and the second radio equipment 2 can perform communication at a low bit error rate (reference numeral 71) shown in FIG. 7. The second radio equipment 2 receives the first radio wave 12 by the antenna 23 and the separation and demodulation circuit 24 demodulates first data transmitted from the first radio equipment 1.

Next, a case where the data transmitter 3 transmits data is discussed. In this case, the data transmitter 3 first receives a first radio wave 13 which has been output from the first radio equipment 1. Also, the sensor 33 outputs data acquired by the sensor 33 to the modulation circuit 32. Then, the modulation circuit 32 modulates the received first radio wave 13 depending on the data acquired by the sensor 33 (second data which is an object for transmission) and outputs the modulated radio wave as the second radio wave 14.

In the case where the data transmitter 3 transmits data, the first radio wave 12 is affected by the second radio wave 14 transmitted from the data transmitter 3, as shown in FIG. 7. Therefore, in this case, the second radio wave 14 transmitted from the data transmitter 3 acts as a disturbance to the first radio wave 12 and, consequently, the bit error rate rises, as indicated by a reference numeral 72 in FIG. 7.

That is, the second radio wave generated by undergoing modulation in the data transmitter 3 disturbs the first radio wave 12 transmitted from first radio equipment 1 and deteriorates the received SN ratio, thus causing the bit error rate to rise. That is, on/off keying modulation, if applied in the data transmitter 3, enables the transmission of second data, exploiting fluctuations in the bit error rate over time as shown in FIG. 7. By detecting these fluctuations in the bit error rate over time at the second receiving equipment 2, it is possible to demodulate the second data transmitted from the data transmitter 3.

The bit error rate 72 which is raised should fall within a range lower than a radio standard value of bit error rate, so that it does not have an adverse effect on the communication between the first radio equipment 1 and the second radio equipment 2. That is, both the bit error rate 71 and the bit error rate 72 should fall within a range lower than a radio standard value of bit error rate. In general, a communication environment changes at all times and is subjected to various disturbances and, thus, radio standards are established to ensure robustness of communication against such disturbances.

The second radio equipment 2 receives the first radio wave 12 and the second radio wave 14 by the antenna 23. Then, the separation and demodulation circuit 24 separates and demodulates first data transmitted from the first radio equipment 1 and second data transmitted from the data transmitter 3 included in these received radio waves and generates demodulated data 25 from the first radio equipment 1 and demodulated data 26 from the data transmitter 3.

Here, the first data which is transmitted by the first radio equipment 1 is carried on the first radio wave 12 having components modulated in accordance with a standard supported by the first radio equipment 1 and the second radio equipment 2 (that is, the radio wave having a carrier frequency pursuant to a standard). On the other hand, the second data which is transmitted by the data transmitter 3 is conveyed by exploiting changes in the bit error rate (i.e., fluctuations in the bit error rate) of the radio waves (first and second radio waves) received by the second radio equipment 2.

When the second radio equipment 2 receives the radio waves, a cycle of changes in the bit error rate of the radio waves (that is, a modulation cycle of bit error rate) is longer than a modulation cycle of the first radio wave 12 having a carrier frequency pursuant to a standard. Accordingly, it is possible to separate the first data transmitted from the first radio equipment 1 and the second data transmitted from the data transmitter 3 by means of the separation and demodulation circuit 24. For example, the separation and demodulation circuit 24 has a low-pass filter (LPF) and can isolate the second data for which the modulation cycle of bit error rate is longer by using the low-pass filter (LPF). Alternatively, for example, the separation and demodulation circuit 24 may be provided with a band-pass filter (BPF); in this case also, it can isolate the second data for which the modulation cycle of bit error rate is longer by using the band-pass filter (BPF). Here, the band-pass filter (BPF) can be configured by combining a low-pass filter (LPF) and a high-pass filter (HPF). At the same time, by using the high-pass filter (HPF), fluctuating components of environmental radio waves, which have a modulation cycle longer than a fluctuation cycle of second data, can be removed from the second data. The separation and demodulation circuit 24 may be a filtering circuit for analog signals or a filtering circuit for digital signals after A/D conversion.

FIG. 8 is a block diagram showing another example of the radio communication system pertaining to the present embodiment. As shown in FIG. 8, a first radio wave 12 and a second radio wave 14 received by the antenna 23 of the second radio equipment 2 may be amplified by an amplifier 27. Also as shown in FIG. 8, a baseband filter 28 may be used as the separation and demodulation circuit 24. An additional filter may be provided, as appropriate, depending on radio wave conditions in surroundings. Filtering may be performed for a frequency band in which the second radio wave 14 is strong. By the amplifier 27 and the filtering, the signal amplitude can be increased to a level that separation and demodulation processing can be performed by the following separation and demodulation circuit 24 (baseband filter 28).

Figure 9:
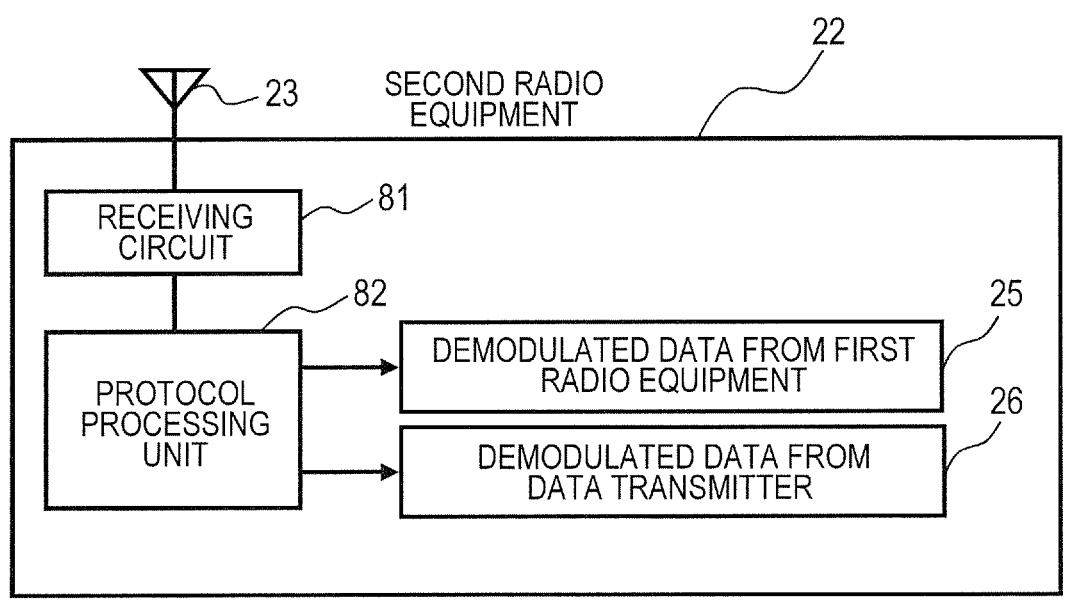
FIG. 9 is a diagram showing another example of a second radio equipment included in the radio communication system pertaining to the first embodiment.

The separation and demodulation circuit 24 provided in the second radio equipment 2 shown in FIG. 1 can be configured as follows. FIG. 9 is a diagram showing a configuration of a second radio equipment 22 in the radio communication system pertaining to the present embodiment. The second radio equipment 22 shown in FIG. 8 includes an antenna 23, a receiving circuit 81, and a protocol processing unit 82 and this configuration is the same as for existing radio equipment. Now, the protocol processing unit 82 is customized by software implementation so that the protocol processing unit 82 of the second radio equipment 22 operates as the separation and demodulation circuit 24 described above. In this way, by software implementation to customize the protocol processing unit 82, the second radio equipment 2 shown in FIG. 1 can be configured using existing radio equipment. In the present embodiment, a part of the protocol processing unit shown in FIG. 9 may be configured by hardware. In this case, the remaining part of the protocol processing unit other than the part configured by hardware is customized by software implementation. The second radio equipment 2 can also be configured in this way.

More specifically, the first data which is transmitted by the first radio equipment 1 is carried on the first radio wave 12 having components modulated in accordance with a standard supported by the first radio equipment 1 and the second radio equipment 2 (that is, the radio wave having a carrier frequency pursuant to a standard). On the other hand, the second data which is transmitted by the data transmitter 3 is conveyed by exploiting changes in the bit error rate (i.e., fluctuations in the bit error rate) of the radio waves (first and second radio waves) received by the second radio equipment 2. And the protocol processing unit 82 is customized by software implementation to separate and demodulate the first data transmitted by the first radio equipment 1 (that is, data transmitted with a carrier frequency pursuant to a standard) and the second data transmitted by the data transmitter 3 (that is, data transmitted by exploiting a bit error rate modulated by a given modulating frequency), respectively. Thereby, demodulated data 25 from the first radio equipment 1 and demodulated data 26 from the data transmitter 3 can be acquired. Such processing in the protocol processing unit 82 is performed in a baseband domain.

Under a radio network environment, heretofore, a special RFID reader/writer wired to or wirelessly connected to the radio network was needed to read data stored on an RFID radio tag (data transmitter). Consequently, a problem existed in which the introduction of a system utilizing an RFID technology into a radio network environment is costly.

However, in the radio communication system pertaining to the present embodiment, under the environment of the radio network formed by the first radio equipment 1 and the second radio equipment 2, the data transmitter 3 generates and outputs the second radio wave 14 by modulating the first radio wave 13 depending on second data which is an object for transmission. Here, the modulated second radio wave 14 acts as a disturbance to the first radio wave 12. Then, the separation and demodulation circuit 24 of the second radio equipment 2 separates the first data transmitted from the first radio equipment 1 and the second data transmitted from the data transmitter 3 by exploiting the presence or absence of a disturbance to the first radio wave 12 and demodulates the first and second data.

In the thus configured radio communication system pertaining to the present embodiment, there is no need for providing a special RFID reader/writer to read data stored on an RFID radio tag (data transmitter 3). Therefore, according to the invention pertaining to the present embodiment, it is possible to provide a radio communication system capable of reducing the cost for introducing a system utilizing RFID technology into a radio network environment.

Further, in the radio communication system pertaining to the present embodiment, it is possible to configure the second radio equipment by software implementation to customize the protocol processing unit 82 of the second radio equipment 22 having an existing hardware structure shown in FIG. 9 to operate as the separation and demodulation circuit 24 shown in FIG. 1. Therefore, because the second radio equipment pertaining to the present embodiment can be configured only by introducing software into the existing hardware structure, it is possible reduce the cost for introducing a system utilizing RFID technology into a radio network environment.

Further, in the radio communication system pertaining to the present embodiment, the amplifier 35 is provided in the modulation circuit 32 of the data transmitter 3, as shown in FIG. 2. In this way, the provision of the amplifier 35 in the modulation circuit 32 can boost the output of the generated second radio wave 14. Thus, the second data can be transmitted from the data transmitter 3 to the second radio equipment 2, even if there is some distance between the data transmitter 3 and the second radio equipment 2.

For a passive-type data transmitter 3 which generates a power supply voltage using radio waves, when radio waves are transmitted by a special RFID reader/writer to supply power to the data transmitter 3, some of the radio waves is not directed to the data transmitter 3. That is, if the RFID reader/writer has a non-directional antenna, there is wasted power of radio waves not directed to the data transmitter 3. Even though the RFID reader/writer has a directional antenna and the efficiency of power transfer is enhanced, wasted and lost power in air still remains as long as power is carried on radio waves.

By contrast, in the radio communication system pertaining to the present embodiment shown in FIG. 8, the power generating circuit 34 of the data transmitter 30 generates power using radio waves (environmental radio waves) that are used for communication between the first radio equipment 1 and the second radio equipment 2. Therefore, because there is no need for newly introducing an RFID reader/writer to output radio waves for power supply, it is possible to reduce power consumption of the radio communication system.

The technology disclosed in Patent Document 1 only detects the presence or absence of a disturbance, but is incapable of discriminating between a disturbance fluctuating over time and data and discriminating between an undesired disturbance source and a desired disturbance. Stated differently, such a radio communication system is subjected to various disturbances due to a changing communication environment, which results in a changing bit error rate. The art disclosed in Patent Document 1 only detects whether a disturbance has changed simply based on the bit error rate, but does not extract a desired disturbance as significant data. By contrast, in the radio communication system pertaining to the present embodiment, second data (data transmitted from the data transmitter) for which the modulation cycle of bit error rate is longer is isolated by means of the separation and demodulation circuit and the second data is demodulated. Thus, it become possible to derive communication data from a desired disturbance, remove noise, which is requisite for fulfilling radio data communication, and select a communication partner in one-to-multiple communication (for detail, see a ninth embodiment), which were impossible in the art disclosed in Patent Document 1.

Another aspect of the present invention relates to a radio communication method for transmitting second data by a data transmitter 3 over a radio network including a first radio equipment 1 that transmits first data and a second radio equipment 2 that receives the first data. The radio communication method includes the following steps: (1) transmitting the first data from the first radio equipment 1 using first radio waves 12, 13; (2) at the data transmitter 3, modulating a first radio wave 13 depending on second data, thus generating a second radio wave 14, and outputting the second radio wave 14; and (3) at the second radio equipment 2, receiving the first radio wave 12 and the second radio wave 14 and separating and demodulating the first data transmitted from the first radio equipment 1 and the second data transmitted from the data transmitter 3 included in the received radio waves. When generating and outputting the second radio wave 14, the data transmitter 3 amplifies a first signal 15 corresponding to the first radio wave 13 depending on the second data, thus generates a second signal 16, and radiates the second signal 16 as the second radio wave 14. In order to amplify the first radio wave 13 depending on the second data, the amplifier 35, for example, shown in FIG. 2 can be used.

According to the embodiment of the present invention described in the foregoing context, it is possible to provide a radio communication system and a radio communication method capable of reducing the cost for introducing a system utilizing RFID technology into a radio network environment. Further, in the present invention pertaining to the present embodiment, because the amplifier 35 is provided in the modulation circuit 32 of the data transmitter 3, the second data can be transmitted from the data transmitter 3 to the second radio equipment 2, even if there is some distance between the data transmitter 3 and the second radio equipment 2.

Second Embodiment

Figure 10:
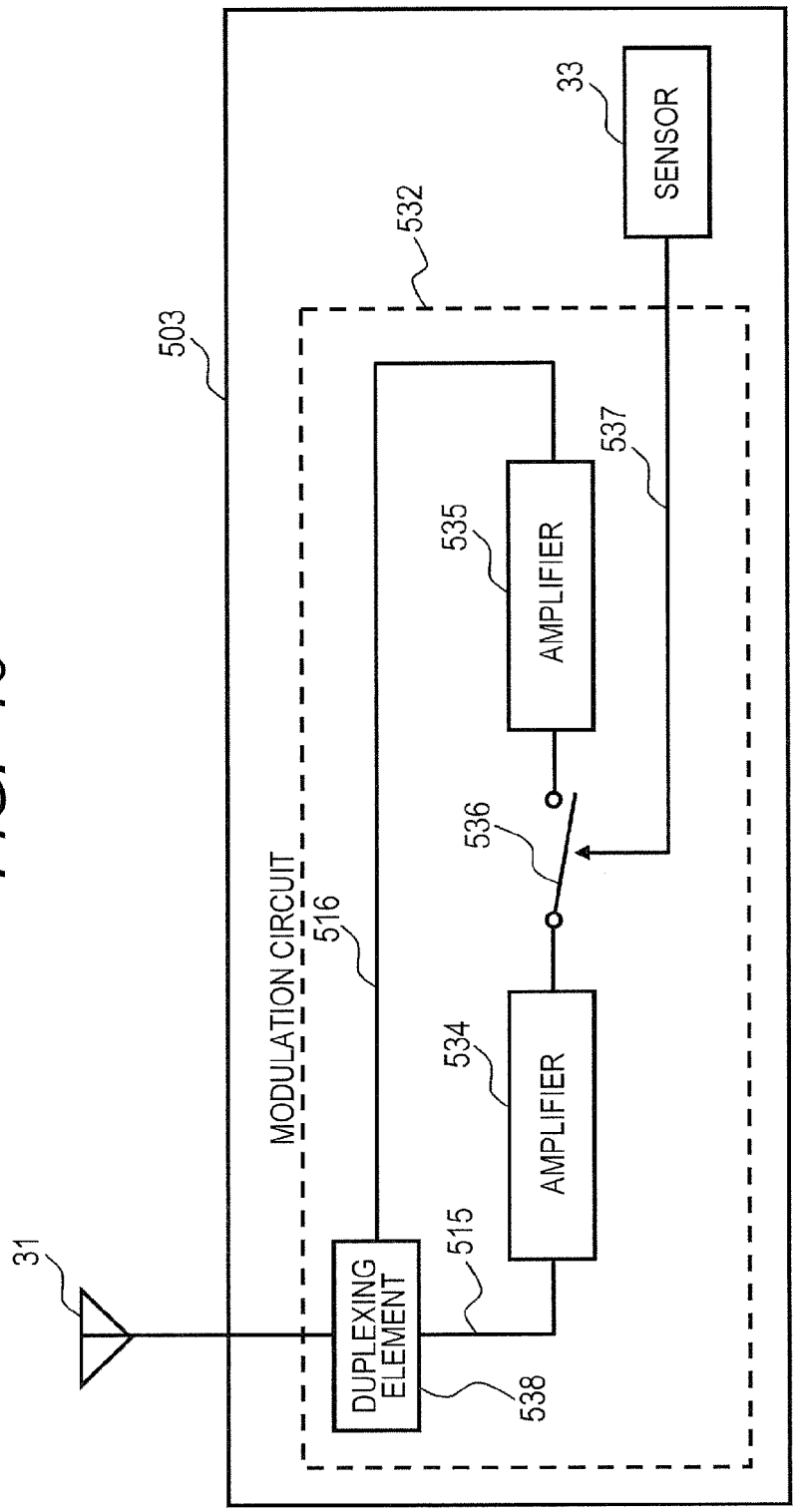
FIG. 10 is a block diagram representing a data transmitter used in a radio communication system pertaining to a second embodiment.

Next, a second embodiment of the present invention is described. FIG. 10 is a block diagram representing a data transmitter 503 included in a radio communication system pertaining to the second embodiment. In the radio communication system pertaining to the present embodiment, the modulation circuit 532 of the data transmitter 503 is provided with two amplifiers 534, 535 and a switch 536, which differs from the radio communication system of the first embodiment (particularly, see FIG. 2). Because others are the same as the radio communication system of the first embodiment and, the same components are assigned the same reference numerals and duplicative description is dispensed with.

The data transmitter 503 shown in FIG. 10 includes an antenna 31, a modulation circuit 532, and a sensor 33. The modulation circuit 532 includes two amplifiers (variable gain amplifiers) 534. 534, a switch 536, and a duplexing element 538. The duplexing element 538 is basically the same as the duplexing element 37 described in the first embodiment. That is, the duplexing element 538 has a function of separating a path 517 (see FIG. 11A) for inputting a first signal 515 corresponding to the first radio wave 13 received by the antenna 31 to an amplifier 534 and a path 518 (see FIG. 11A) for outputting an amplified second signal 516 from an amplifier 535 to the antenna 31. As the duplexing element 538, for example, a directional coupler can be used.

Besides, the switch 536 is provided between the amplifier 534 and the amplifier 535. The switch 536 makes and breaks an electrical contact between the amplifier 534 and the amplifier 535 according to a control signal 537 corresponding to second data which is an object for transmission.

For example, as shown in FIG. 11A, if second data which is an object for transmission is "1" (i.e., the control signal 537 is "1"), the switch 536 is put in a conducting state and the amplifier 534 and the amplifier 535 are coupled to each other via the switch 536. At this time, the amplifier 534 and the amplifier 535 amplify the first signal 515 corresponding to the first radio wave 13 received by the antenna 31 and thus generates the second signal 516. The generated second signal 516 is radiated from the antenna 31 as the second radio wave 14 which acts as a disturbance to the first radio wave 12. At this time, by amplifying the amplitude of the first radio wave 13 using the amplifier 534 and the amplifier 535, the stronger second radio wave 14 can be output from the antenna 31. In this way, data of "1" is transmitted from the data transmitter 503 to the second radio equipment 2.

On the other hand, as shown in FIG. 11B, if second data which is an object for transmission is "0" (i.e., the control signal 36 is "0"), the switch 536 is put in a non-conducting state and the amplifier 534 and the amplifier 535 are uncoupled. Thus, because the signal amplified by the amplifier 534 is not supplied to the amplifier 535, the second signal 516 is not output from the amplifier 535. Therefore, the second radio wave 14 is not radiated from the antenna 31. In this way, data of "0" is transmitted from the data transmitter 503 to the second radio equipment 2.

In this case, the amplifier 534 following the antenna 31 is configured as a low noise amplifier and the amplifier 535 that outputs the second signal 516 to the antenna 31 is configured as a high gain amplifier matched with the antenna 31. Thereby, the SN ratio of a signal can be minimized and it is possible to extend the communication distance between the data transmitter 503 and the second radio equipment 2.

As described above, in the radio communication system pertaining to the present embodiment, the amplifiers 534, 535 are provided in the modulation circuit 532 of the data transmitter 503, as shown in FIG. 10. In this way, the provision of the amplifiers 534, 535 in the modulation circuit 532 can boost the output of the generated second radio wave 14. Thus, the second data can be transmitted from the data transmitter 503 the second radio equipment 2, even if there is some distance between the data transmitter 503 and the second radio equipment 2.

Third Embodiment

Next, a third embodiment of the present invention is described. In the data transmitter 3 shown in FIG. 2, the second signal 16 is prevented from being fed back to the amplifier 35 by means of the duplexing element 37. However, if the function of the duplexing element 37 is insufficient, a part of the second signal 16 might be fed back to the amplifier 35. In such a case, the modulation circuit might oscillate depending on setting of circuit design parameters (amplification factor or the like, phase margin, etc.)

In the radio communication system pertaining to the third embodiment, a data transmitter is described in which the oscillation of a modulation circuit can be avoided. Because others are the same as the radio communication system of the first embodiment and, the same components are assigned the same reference numerals and duplicative description is dispensed with.

Figure 12:
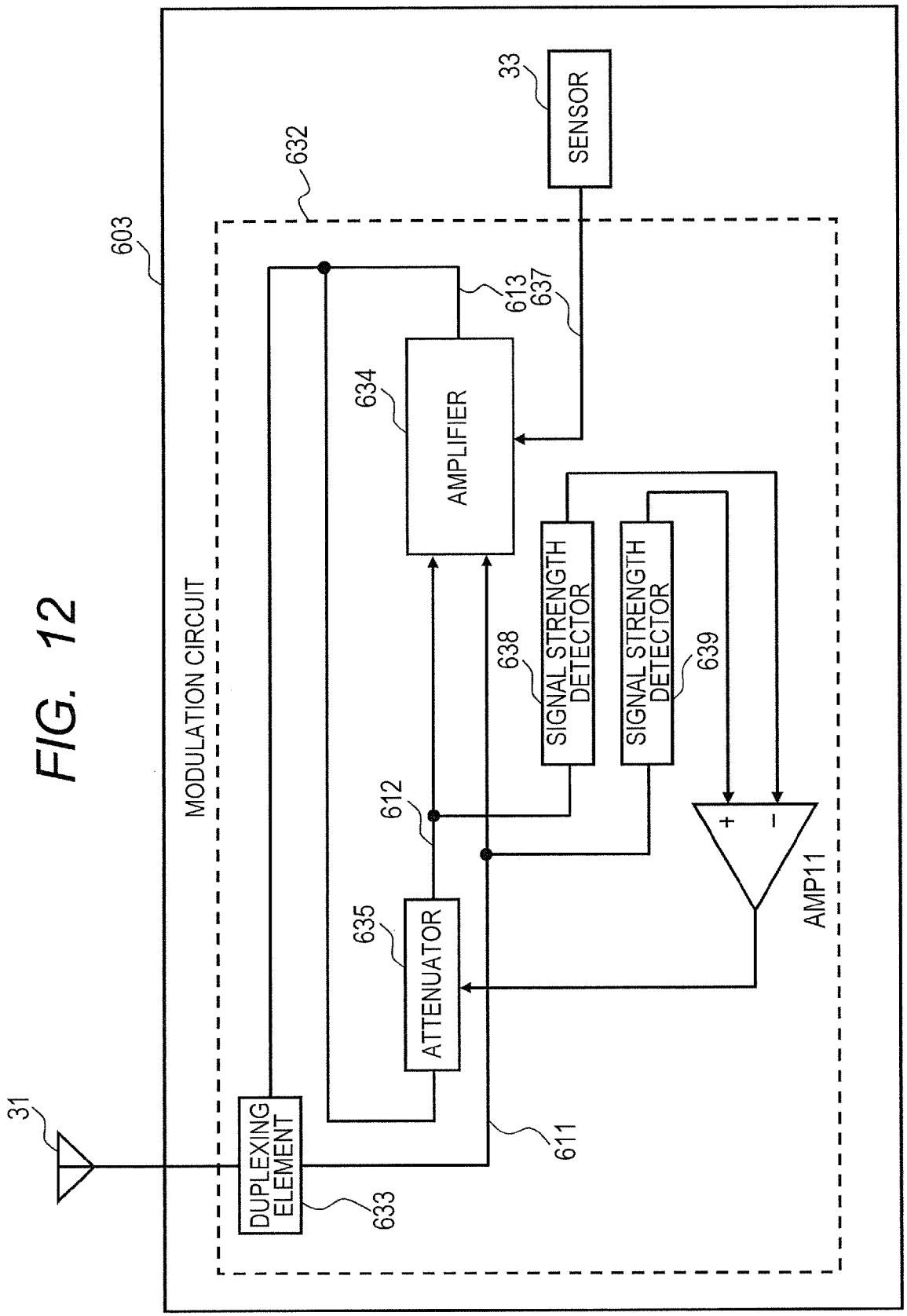
FIG. 12 is a block diagram representing a data transmitter used in a radio communication system pertaining to a third embodiment.

FIG. 12 is a block diagram representing a data transmitter used in the radio communication system pertaining to the present embodiment. The data transmitter 603 shown in FIG. 12 includes a modulation circuit 632 and a sensor 33. The modulation circuit 632 includes a duplexing element 633, an amplifier 634, an attenuator 635, signal strength detectors 638, 639, and an operational amplifier AMP11.

The duplexing element 633 is basically the same as the duplexing element 37 described in the first embodiment. That is, the duplexing element 633 has a function of separating a path for inputting a first signal 611 corresponding to the first radio wave 13 received by the antenna 31 to the amplifier 634 and a path for outputting an amplified second signal 613 from the amplifier 634 to the antenna 31. As the duplexing element 633, for example, a directional coupler can be used.

As the amplifier 634, for example, a variable gain amplifier with two inputs can be used. The amplifier 634 takes the inputs of a first signal 611 corresponding to the first radio wave 13 received by the antenna 31 and a signal (third signal) which has been output from the attenuator 635 and generates an amplified second signal 613 according to a gain control signal 637. The generated second signal 613 is supplied via the duplexing element 633 to the antenna 31 and radiated as the second radio wave 14 from the antenna 31.

For example, if the gain control signal 637 is "1", the amplifier takes the inputs of the first signal 611 corresponding to the first radio wave 13 received by the antenna 31 and the signal 612 output from the attenuator 635 and generates the amplified second signal 613. The generated second signal 613 is radiated from the antenna 31 as the second radio wave 14 which acts as a disturbance to the first radio wave 12. In this way, data of "1" is transmitted from the data transmitter 603 to the second radio equipment.

On the other hand, if the gain control signal 637 is "0", the amplifier 634 takes the inputs of the first signal 611 corresponding to the first radio wave 13 received by the antenna 31 and the signal 612 output from the attenuator 635 and generates a second signal 613 with a reduced amplitude. In this case, the second signal 613 that is output from the amplifier 634 is a signal with a sufficiently small amplitude and, thus, does not act as a disturbance to the first radio wave 12. In this way, data of "0" is transmitted from the data transmitter 603 to the second radio equipment. If the gain control signal 637 is "0", the amplifier 634 may regulate the amplitude of the first signal 611 corresponding to the first radio wave 13 received by the antenna 31 to zero. At this time, no second signal 613 is output from the amplifier 634 and, thus, no second radio wave 14 is radiated from the antenna 31.

The attenuator 635 attenuates the second signal 613 which has been output from the amplifier 634 to a level that is as strong as the first signal 611 and outputs the attenuated signal 612 to the amplifier 634. That is, the second signal 613 which has been output from the amplifier 634 is fed back via the attenuator 635 to the amplifier 634.

A signal strength detector 638 detect the strength of the signal 612 that has been output from the attenuator 635 and outputs a signal corresponding to the detected signal strength to an inverting input terminal of the operational amplifier AMP11. A signal strength detector 639 detects the strength of the first signal 611 corresponding to the first radio wave 13 received by the antenna 31 and outputs a signal corresponding to the detected signal strength to a non-inverting input terminal of the operational amplifier AMP11. The signal strength detectors 638, 639 are, for example, the circuits capable of converting an amplitude level of the signals 611, 612 to a DC voltage.

The operational amplifier AMP11 adjusts the amount of attenuation by the attenuator 635 so that the strength of the first signal 611 detected by the signal strength detector 639 equals the strength of the signal 612 detected by the signal strength detector 638.

Stated differently, in the modulation circuit 632 shown in FIG. 12, the second signal 613 that has been output from the amplifier 634 is attenuated to be as strong as the first signal 611 and the attenuated signal 612 is fed back to the amplifier 634. Then, the output of the amplifier 634 is decreased by the signal 612. Thereby, a feedback loop through the amplifier 634 can be stabilized and it is possible to avoid the oscillation of the modulation circuit 632. In this case, the signal strength detectors 638, 639, the operational amplifier AMP11, and the attenuator 635 form a feedback loop so that the strength of the first signal 611 corresponding to the first radio wave 13 received by the antenna 31 equals the strength of the signal 612 that has been output from the attenuator 635.

Figure 13:
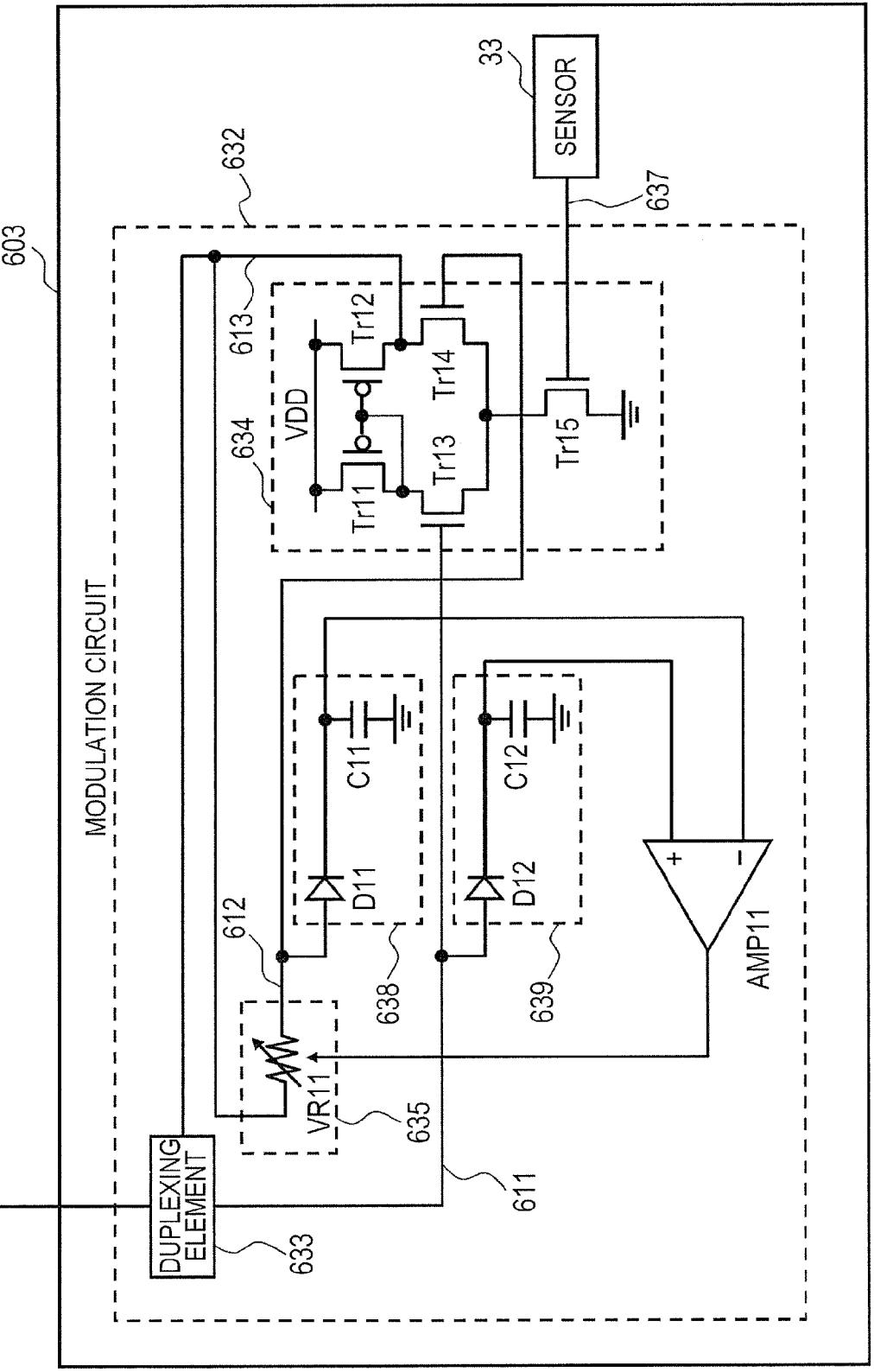
FIG. 13 is a circuit diagram showing a concrete example of the data transmitter shown in FIG. 12.

FIG. 13 is a circuit diagram showing a concrete example of the data transmitter 603 shown in FIG. 12. The data transmitter 603 shown in FIG. 13 is one example and, in the present embodiment, any data transmitter that can implement the operation described above can be used, not limited to the data transmitter shown in FIG. 13.

As shown in FIG. 13, the amplifier 634 includes P-type transistors Tr11, Tr12 and N-type transistors Tr13 to Tr15. A source of a P-type transistor Tr11 is coupled to a power supply VDD and its gate and drain are coupled to a gate of a P-type transistor Tr12. For the P-type transistor Tr12, its source is coupled to the power supply VDD, its gate is coupled to the gate and drain of the P-type transistor Tr11, and its drain is coupled to a drain of an N-type transistor Tr14.

A drain of an N-type transistor Tr13 is coupled to the gate and drain of the P-type transistor Tr11 and to the gate of the P-type transistor Tr12. The first signal 611 is supplied to a gate of the N-type transistor Tr13. The drain of the N-type transistor Tr14 is coupled to the drain of the P-type transistor Tr12. The signal 612 is supplied to a gate of the N-type transistor Tr14. The sources of the N-type transistor Tr13 and the N-type transistor Tr14 are coupled to a drain of an N-type transistor Tr15. A source of the N-type transistor Tr15 is grounded and its gate is supplied with the gain control signal 637. The second signal 613 is output from a node at which the drain of the P-type transistor Tr12 and the drain of the N-type transistor Tr14 are coupled. In other words, the amplifier 634 is configured as a differential amplifier.

The signal strength detector 638 is configured with a diode D11 for half-wave rectification and a capacitor C11. The signal 612 is supplied to an anode of the diode D11 and its cathode is coupled to one end of the capacitor C11. The other end of the capacitor C11 is grounded.

The signal strength detector 639 is configured with a diode D12 for half-wave rectification and a capacitor C12. The first signal 611 is supplied to an anode of the diode D12 and its cathode is coupled to one end of the capacitor C12. The other end of the capacitor C12 is grounded.

The attenuator 635 is configured with a variable resistor VR11. The second signal 613 is supplied to one end of the variable resistor VR11 and the signal 612 is output from its other end. A resistance value of the variable resistor VR11 is adjusted based on a signal that is output from the operational amplifier AMP11.

In the data transmitter 603 shown in FIG. 13, if the gain control signal 637 is "0", the N-type transistor Tr15 is put in an off state. In this case, no amplified second signal 613 is output from the amplifier 634. On the other hand, if the gain control signal 637 is "1", the N-type transistor Tr15 is put in an on state. In this case, the second signal 613 amplified depending on the first signal 611 and the signal 612 is output from the amplifier 634. The amplified second signal 613 is supplied via the duplexing element 633 to the antenna 31 and radiated as the second radio wave 14 from the antenna 31

The signal strength detector 638 converts the amplitude of the signal 612 to a strength signal (DC component) and outputs the strength signal to the inverting input terminal of the operational amplifier AMP11. The signal strength detector 639 converts the amplitude of the first signal 611 to a strength signal (DC component) and outputs the strength signal to the non-inverting input terminal of the operational amplifier AMP11. The operational amplifier AMP11 adjusts the resistance value of the attenuator 635 so that the strength of the first signal detected by the signal strength detector 639 equals the strength of the signal 612 detected by the signal strength detector 638. Although the signals that are handled by the signal strength detectors 638, 639, the operational amplifier AMP11, and the variable resistor VR11 are assumed to be analog values, these components may be changed to a circuit that handles digital values.

As described above, in the radio communication system pertaining to the present embodiment, the second signal 613 that is output from the amplifier 634 is attenuated to be as strong as the first signal 611 and the attenuated signal 612 is fed back to the amplifier 634. Then, the output of the amplifier 634 is decreased by the signal 612. Thereby, a feedback loop through the amplifier 634 can be stabilized and it is possible to avoid the oscillation of the modulation circuit 632.

Also in the radio communication system pertaining to the present embodiment, the amplifier 634 is provided in the modulation circuit 632 of the data transmitter 603, as shown in FIG. 12. In this way, the provision of the amplifier 634 in the modulation circuit 632 can boost the output of the generated second radio wave 14. Thus, the second data can be transmitted from the data transmitter 603 to the second radio equipment 2, even if there is some distance between the data transmitter 603 and the second radio equipment 2.

Fourth Embodiment

Next, a fourth embodiment of the present invention is described. In the data transmitter 3 shown in FIG. 2, the transmission of the second radio wave 14 with a large strength is made possible by using the amplifier 35 provided inside the data transmitter 3. However, the strength of the second radio wave 14 that is output from the data transmitter 3 may become too large depending on setting of the amplifier 35 and may have an impact on other electronic devices.

In the radio communication system pertaining to the present embodiment, a data transmitter is described in which the second radio wave that is output from the data transmitter can be constrained to a prescribed strength. Because others are the same as the radio communication system of the first embodiment and, the same components are assigned the same reference numerals and duplicative description is dispensed with.

Figure 14:
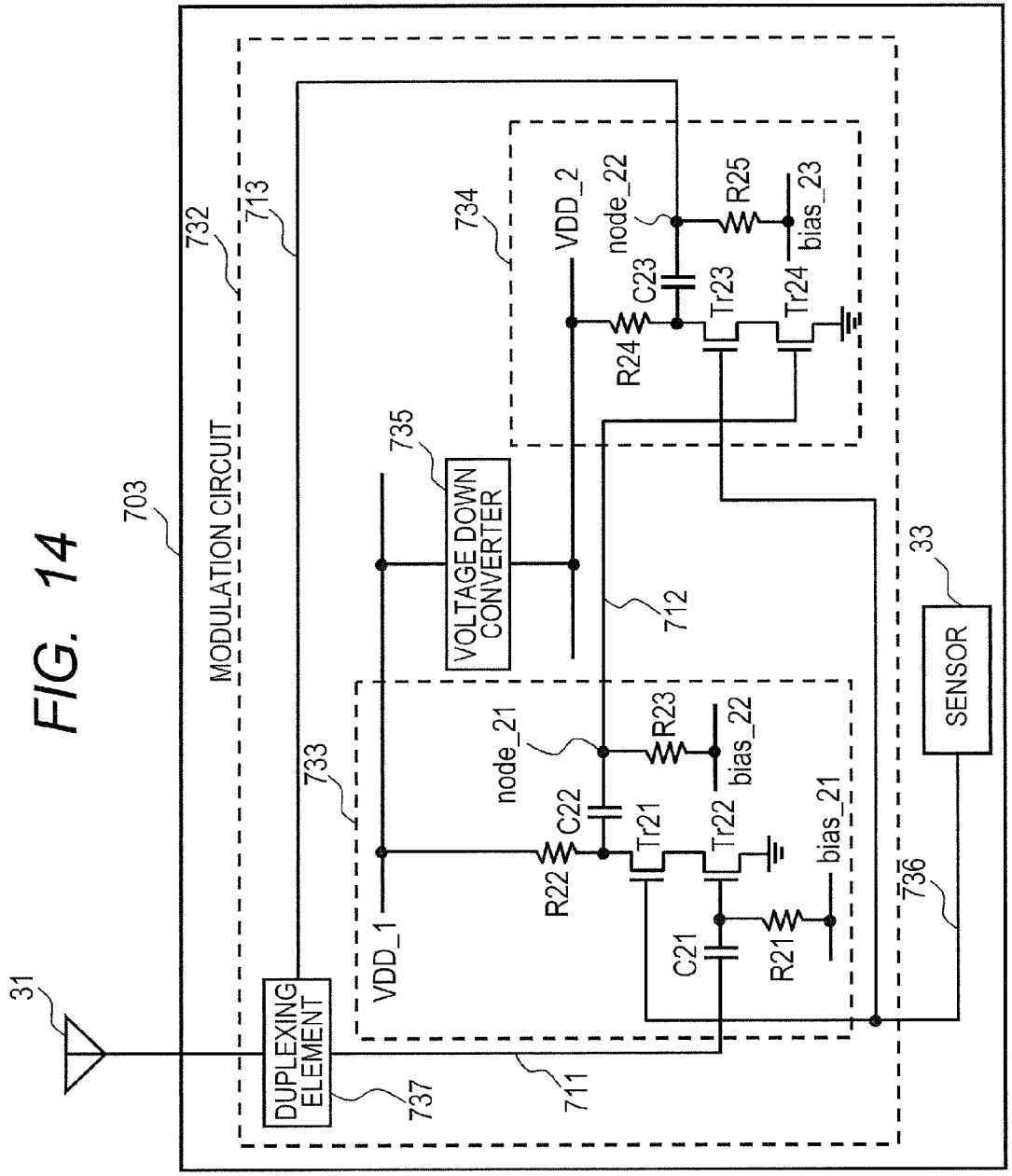
FIG. 14 is a block diagram representing a data transmitter used in a radio communication system pertaining to a fourth embodiment.

FIG. 14 is a circuit diagram representing a data transmitter 703 used in the radio communication system pertaining to the present embodiment. The data transmitter 703 shown in FIG. 14 includes a modulation circuit 732 and a sensor 33. The modulation circuit 732 includes amplifiers (single-end amplifier) 733, 734, a voltage down converter 735, and a duplexing element 737. Here, the amplifiers (single-end amplifier) 733, 734 and the voltage down converter 735 form a variable gain amplifier with an amplitude limiting function.

The duplexing element 737 is basically the same as the duplexing element 37 described in the first embodiment. That is, the duplexing element 737 has a function of separating a path for inputting a first signal 711 corresponding to the first radio wave 13 received by the antenna 31 to an amplifier 733 and a path for outputting an amplified second signal 713 from an amplifier 734 to the antenna 31. As the duplexing element 737, for example, a directional coupler can be used.

As shown in FIG. 14, the amplifier 733 includes N-type transistors Tr21, Tr22, capacitors C21, C22, and resistors R21, R22, R23. The first signal 711 corresponding to the first radio wave 13 received by the antenna 31 is supplied to one end of a capacitor C21. The other end of the capacitor C21 is coupled to one end of a resistor R21 and to a gate of an N-type transistor Tr22. A bias voltage bias_21 is supplied to the other end of the resistor R21. For the N-type transistor Tr22, its drain is coupled to a source of an N-type transistor Tr21 and its source is grounded.

For the N-type transistor Tr21, its gate is supplied with a gain control signal 736 and its drain is coupled to one end of a resistor R22 and to one end of a capacitor C22. The other end of the resistor R22 is coupled to a power supply VDD_1. The other end of the capacitor C22 is coupled to one end of a resistor R23. A bias voltage bias_22 is supplied to the other end of the resistor R23. A signal 712 amplified by the amplifier 733 is output from a node node_21 at which the other end of the capacitor C22 and the one end of the resistor R23 are coupled and to the amplifier 734.

The amplifier 734 includes N-type transistors Tr23, Tr24, a capacitor C23, and resistors R24, R25. For an N-type transistor Tr24, its drain is coupled to a source of an N-type transistor Tr23, its gate is supplied with the signal 712 output from the amplifier 733, and its source is grounded. For the N-type transistor Tr23, its gate is supplied with the gain control signal 736 and its drain is coupled to one end of a resistor R24 and to one end of a capacitor C23. The other end of the resistor R24 is coupled to a power supply VDD_2. The other end of the capacitor C23 is coupled to one end of a resistor R25. A bias voltage bias_23 is supplied to the other end of the resistor 25. A second signal 713 amplified by the amplifier 734 is output from a node node_22 at which the other end of the capacitor 23 and the one end of the resistor R25 are coupled.

The voltage down converter 735 converts a power supply voltage VDD_1 to a power supply voltage VDD_2 that is lower than the power supply voltage VDD_1.

In the amplifiers 733, 734 shown in FIG. 14, if the gain control signal 736 is "0", the N-type transistor Tr21 of the amplifier 733 and the N-type transistor Tr23 of the amplifier 734 are put in an off state and, thus, no amplified second signal 713 is output from the amplifier 734.

On the other hand, if the gain control signal 736 is "1", the N-type transistor Tr21 of the amplifier 733 is put in an on state. At this time, the first signal 711 increased as much as the bias voltage bias_21 is supplied to the gate of the N-type transistor Tr22. Thereby, the N-type transistor Tr22 operates in response to the first signal 711 and, thus, the signal 712 yielded by amplifying the first signal 711 is output from the node node_21.

If the gain control signal 736 is "1", the N-type transistor Tr23 of the amplifier 734 is also put in an on state. At this time, the signal 712 output from the amplifier 733 is supplied to the gate of the N-type transistor Tr24. Thus, the N-type transistor Tr24 operates in response to the signal 712 and the second signal 713 yielded by amplifying the signal 712 is output from the node node_22. At this time, because the power supply voltage VDD_2 is lower than the power supply voltage VDD_1, the amplitude of the second signal that is output from the node node_22 is smaller than the amplitude of the signal 712 output from the amplifier 733. The amplified second signal 713 is supplied via the duplexing element 737 to the antenna 31 and radiated as the second radio wave 14 from the antenna 31

In the data transmitter 703 pertaining to the present embodiment, the power supply voltage VDD_2 of the amplifier 734 is set lower than the power supply voltage VDD_1 by means of the voltage down converter 735. Thereby, the amplitude of the second signal 713 amplified by the amplifier 734 can be made smaller than the power supply voltage VDD_2. Thus, it is possible to constrain the strength of the second radio wave that is output from the data transmitter to a prescribed strength.

Figure 15:
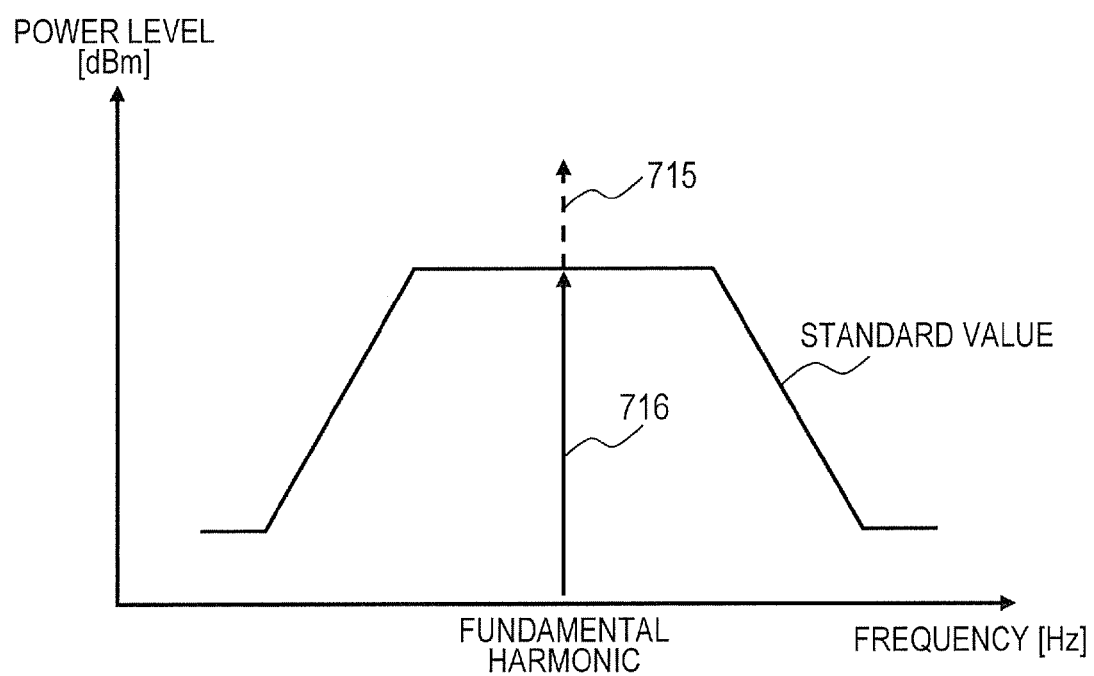
FIG. 15 is a diagram for explaining the effect of the invention pertaining to the fourth embodiment.

FIG. 15 is a diagram for explaining the effect of the invention pertaining to the present embodiment. In the case of the data transmitter 3 pertaining to the first embodiment, the strength of the second radio wave 14 that is output from the data transmitter 3 may become larger than a standard value in some circumstances, depending on setting of the amplifier 35 (see a part marked with a reference numeral 715). By contrast, because the variable gain amplifier with an amplitude limiting function is used in the data transmitter pertaining to the present embodiment, the strength of the second radio wave 14 can be kept below the standard value (see a part marked with a reference numeral 716). In this case, the strength of the second radio wave that is output from the data transmitter can be adjusted by modifying a value of the power supply voltage VDD_2 that is set by the voltage down converter 735.

The above-described variable gain amplifier with an amplitude limiting function, which is formed of the amplifiers 733, 4 and the voltage down converter 735, is one example. Any amplifier that can constrain the strength of the second radio wave to a prescribed strength may be used.

Fifth Embodiment

Next, a fifth embodiment of the present invention is described. In the data transmitter 3 shown in FIG. 2, a harmonic distortion might occur when the amplifier 35 provided inside the data transmitter 3 operates in a nonlinear domain. When the power level of such a harmonic distortion is too large, it might have an impact on other electronic devices.

In the radio communication system pertaining to the present embodiment, a data transmitter is described in which the power level of a harmonic distortion can be constrained below a standard value. Because others are the same as the radio communication system of the first embodiment and, the same components are assigned the same reference numerals and duplicative description is dispensed with.

Figure 16:
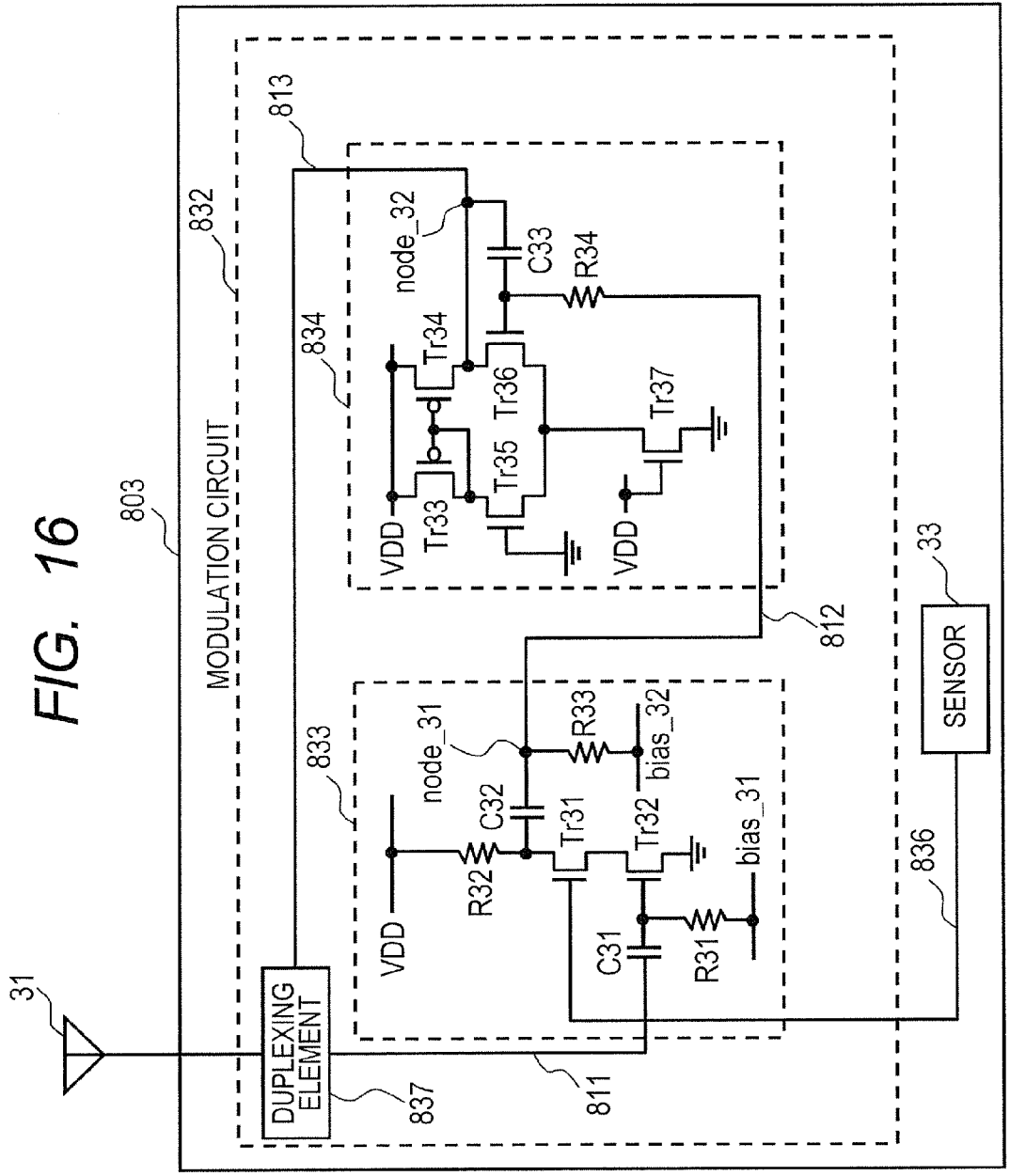
FIG. 16 is a block diagram representing a data transmitter used in a radio communication system pertaining to a fifth embodiment.

FIG. 16 is a circuit diagram representing a data transmitter 803 used in the radio communication system pertaining to the present embodiment. The data transmitter 803 shown in FIG. 16 includes a modulation circuit 832 and a sensor 33. The modulation circuit 832 includes an amplifier (single-end amplifier) 833, a harmonic elimination circuit (low-pass filter) 834, and a duplexing element 837. Here, the amplifier 833 and the harmonic elimination circuit 834 form a variable gain amplifier with a harmonic elimination function.

The duplexing element 837 is basically the same as the duplexing element 37 described in the first embodiment. That is, the duplexing element 837 has a function of separating a path for inputting a first signal 811 corresponding to the first radio wave 13 received by the antenna 31 to the amplifier 833 and a path for outputting an amplified second signal 813 from the harmonic elimination circuit 834 to the antenna 31. As the duplexing element 837, for example, a directional coupler can be used.

As shown in FIG. 16, the amplifier 833 includes N-type transistors Tr31, Tr32, capacitors C31, C32, and resistors R31, R32, R33. The first signal 811 corresponding to the first radio wave 13 received by the antenna 31 is supplied to one end of a capacitor C31. The other end of the capacitor C31 is coupled to one end of a resistor R31 and to a gate of an N-type transistor Tr32. A bias voltage bias_31 is supplied to the other end of the resistor R31. For the N-type transistor Tr32, its drain is coupled to a source of an N-type transistor Tr31 and its source is grounded.

For the N-type transistor Tr31, its gate is supplied with a gain control signal 836 and its drain is coupled to one end of a resistor R32 and to one end of a capacitor C32. The other end of the resistor R32 is coupled to a power supply VDD. The other end of the capacitor C32 is coupled to one end of a resistor R33. A bias voltage bias_32 is supplied to the other end of the resistor R33. A signal 812 amplified by the amplifier 833 is output from a node node_31 at which the other end of the capacitor C32 and the one end of the resistor R33 are coupled and to the harmonic elimination circuit 834.

The harmonic elimination circuit 834 includes P-type transistors Tr33, Tr34, N-type transistors Tr35 to Tr37, a capacitor C33, and a resistor 34. For a P-type transistor Tr33, its source is coupled to a power supply VDD and its gate and drain are coupled to a gate of a P-type transistor Tr34. For the P-type transistor Tr34, its source is coupled to the power supply VDD, its gate is coupled to the gate and drain of the P-type transistor Tr33, and its drain is coupled to a drain of an N-type transistor Tr36.

For an N-type transistor Tr35, its drain is coupled to the gate and drain of the P-type transistor Tr33 and to the gate of the P-type transistor Tr34 and its gate is grounded. The drain of the N-type transistor Tr36 is coupled to the drain of the P-type transistor Tr34. The signal 812 is supplied via the resistor R34 to a gate of the N-type transistor Tr36. The sources of the N-type transistor Tr35 and the N-type transistor Tr36 are coupled to a drain of an N-type transistor Tr37. For the N-type transistor Tr37, its source is grounded and its gate is coupled to the power supply VDD. The capacitor C33 is coupled between the gate and drain of the N-type transistor Tr36. The harmonic elimination circuit (low-pass filter) shown in FIG. 16 is configured to have a frequency characteristic marked with a reference numeral 815 in FIG. 17.

In the amplifier 833 shown in FIG. 16, if the gain control signal 836 is "0", the N-type transistor Tr31 is put in an off state and, thus, no amplified second signal 813 is output.

On the other hand, if the gain control signal 836 is "1", the N-type transistor Tr31 of the amplifier 833 is put in an on state. At this time, the first signal 811 increased as much as the bias voltage bias_31 is supplied to the gate of the N-type transistor Tr32. Thereby, the N-type transistor Tr32 operates in response to the first signal 811 and, thus, the signal 812 yielded by amplifying the first signal 811 is output from the node node_31.

Figure 17:
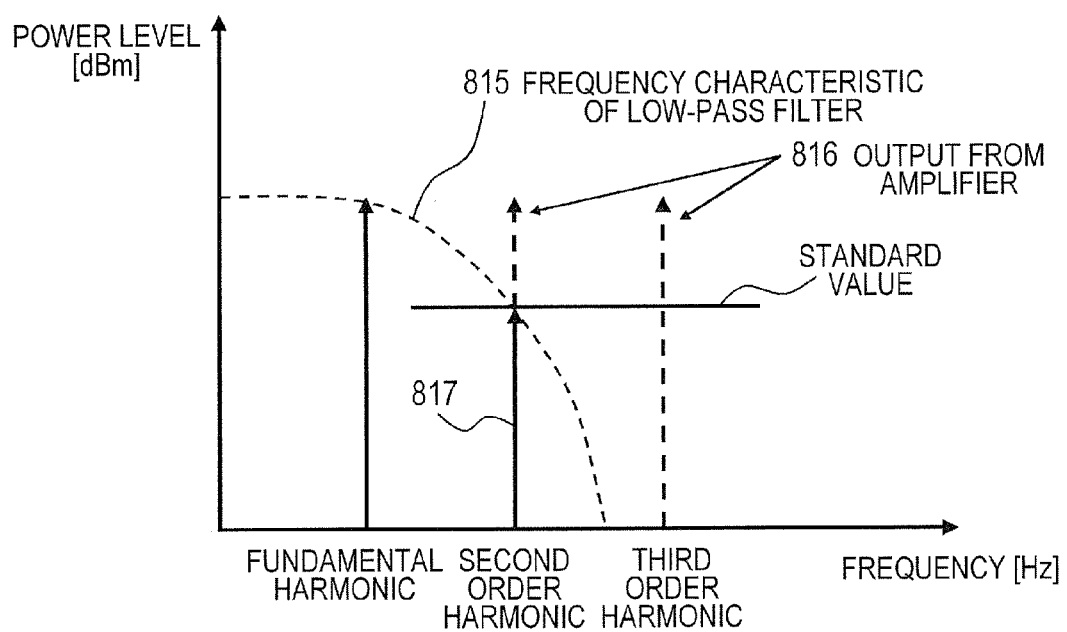
FIG. 17 is a diagram for explaining the effect of the invention pertaining to the fifth embodiment.

For the signal 812 that has been output from the amplifier 833, its harmonic component is eliminated by the harmonic elimination circuit 834 having the frequency characteristic marked with the reference numeral 815 in FIG. 17. Then, the second signal 813 amplified by the amplifier 833 and whose harmonic component was eliminated by the harmonic elimination circuit 834 is output from the node node_32. The second signal 813 is supplied via the duplexing element 837 to the antenna 31 and radiated as the second radio wave 14 from the antenna 31.

FIG. 17 is a diagram for explaining the effect of the invention pertaining to the present embodiment. In the data transmitter 3 pertaining to the first embodiment, when the amplifier 35 provided inside the data transmitter 3 operates in a nonlinear domain, a harmonic distortion (marked with a reference numeral 816) might occur. When the power level of this harmonic distortion is too large, it might have an impact on other electronic devices. By contrast, because the variable gain amplifier with a harmonic elimination function is used in the data transmitter 803 pertaining to the present embodiment, the power level of the harmonic distortion can be constrained below a standard value. That is, as shown in FIG. 17, the power level of a second-order harmonic can be kept below the standard value (see a part marked with a reference numeral 817) and the electric field strength of a third-order harmonic can be nullified.

The above-described variable gain amplifier with a harmonic elimination function, which is formed of the amplifier 833 and the harmonic elimination circuit 834, is one example. Any amplifier that can constrain the power level of a harmonic distortion below a standard value may be used.

Sixth Embodiment

Figure 18:
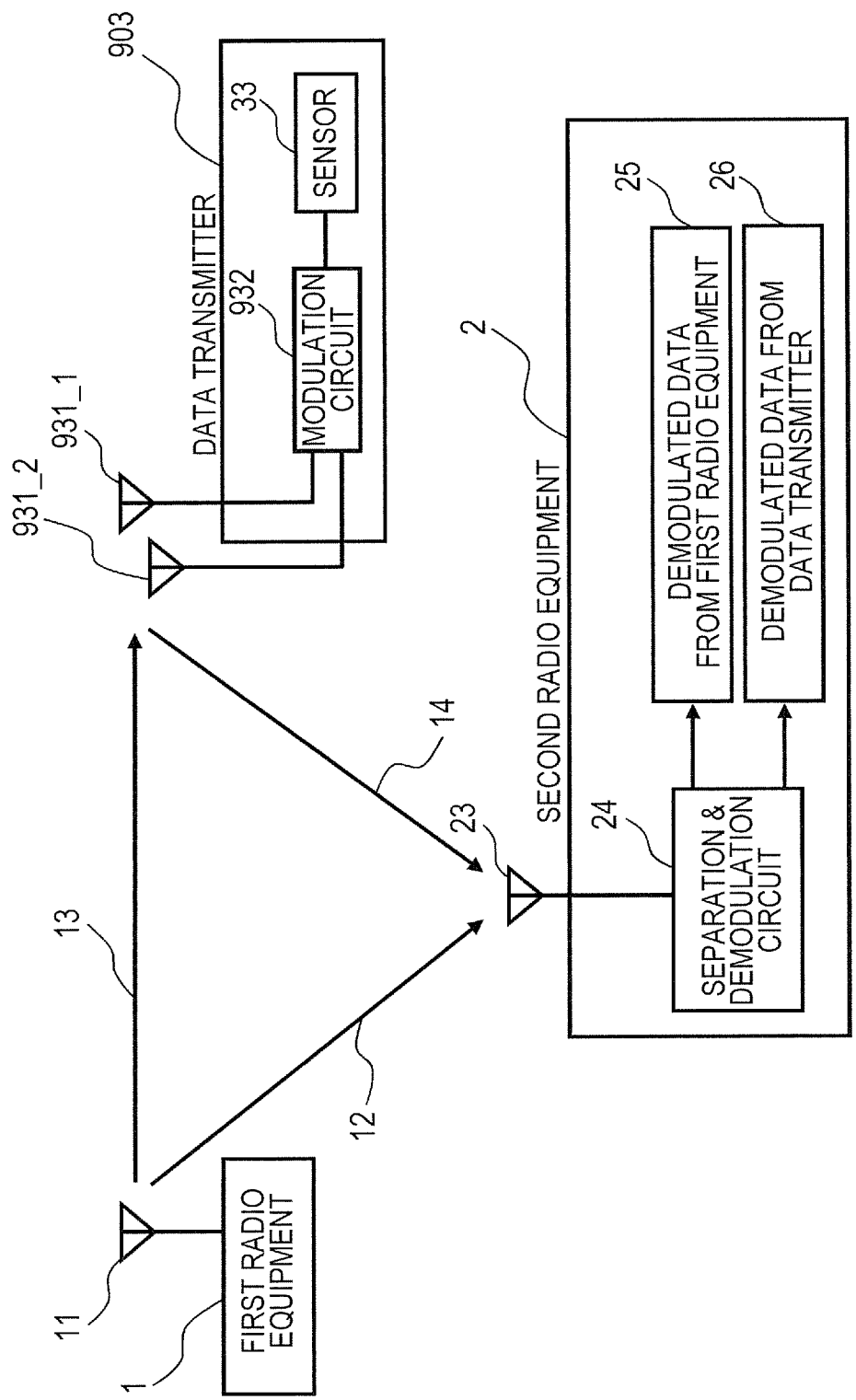
FIG. 18 is a block diagram representing a radio communication system pertaining to a sixth embodiment.

Next, a sixth embodiment of the present invention is described. FIG. 18 is a block diagram representing a radio communication system pertaining to the sixth embodiment.

Figure 19:
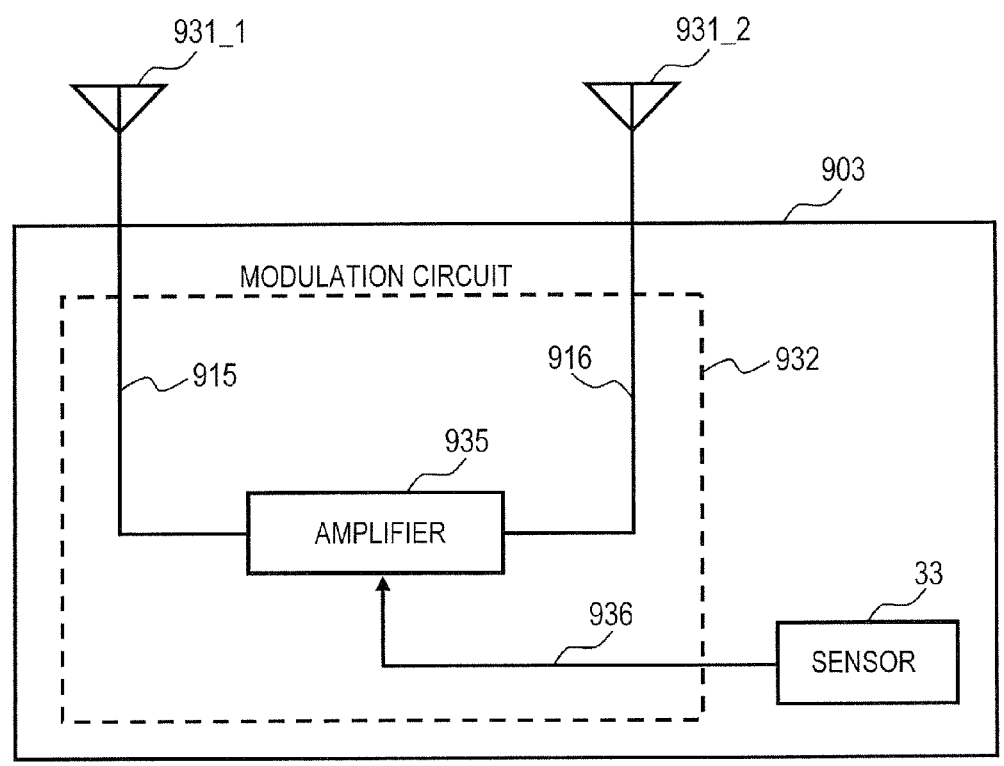
FIG. 19 is a block diagram representing a data transmitter used in the radio communication system pertaining to the sixth embodiment.

FIG. 19 is a block diagram representing a data transmitter 903 used in the radio communication system pertaining to the sixth embodiment. In the radio communication system pertaining to the present embodiment, the first radio wave 13 is received by a receiving antenna 931_1 of the data transmitter 903 and the second radio wave 14 is transmitted from a transmitting antenna 931_2, which differs from the radio communication system pertaining to the first embodiment. Because others are the same as the radio communication system of the first embodiment and, the same components are assigned the same reference numerals and duplicative description is dispensed with.

The data transmitter 903 shown in FIG. 19 includes the receiving antenna 931_1, the transmitting antenna 931_2, a modulation circuit 932, and a sensor 33. The modulation circuit 932 includes an amplifier (variable gain amplifier) 935. The modulation circuit 932 generates the second radio wave 14 by modulating the first radio wave 13 depending on second data which is an object for transmission.

In particular, the amplifier 935 provided in the modulation circuit 932 amplifies a first signal 915 corresponding to the first radio wave 13 received by the receiving antenna 931_1, depending on second data, and thus generates a second signal 916. The generated second signal 916 is radiated as the second radio wave 14 from the transmitting antenna 931_2. The amplifier 935 is capable of changing its amplification factor according to a gain control signal 936. Here, a value of the gain control signal 936 corresponds to second data which is an object for transmission.

Figure 20A:
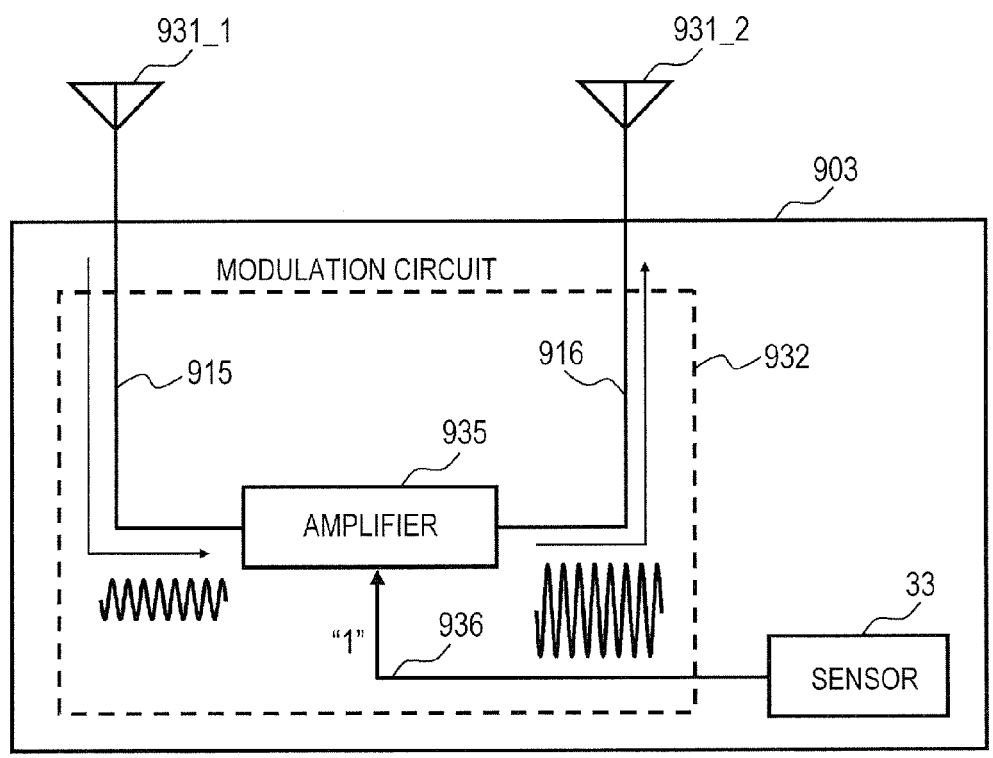
FIG. 20A is a diagram for explaining operation of the data transmitter shown in FIG. 19.

For example, as shown in FIG. 20A, if second data which is an object for transmission is "1" (i.e., the gain control signal 936 is "1"), the amplifier 935 amplifies the first signal 915 corresponding to the first radio wave 13 received by the receiving antenna 931_1 and generates the second signal 916 with a larger amplitude. The generated second signal 916 is radiated from the transmitting antenna 931_2 as the second radio wave 14 which acts as a disturbance to the first radio wave 12. At this time, it is possible to output a stronger second radio wave 14 from the transmitting antenna 931_2 by increasing the amplification factor of the amplifier 935. In this way, data of "1" is transmitted from the data transmitter 903 to the second radio equipment 2.

Figure 20B:
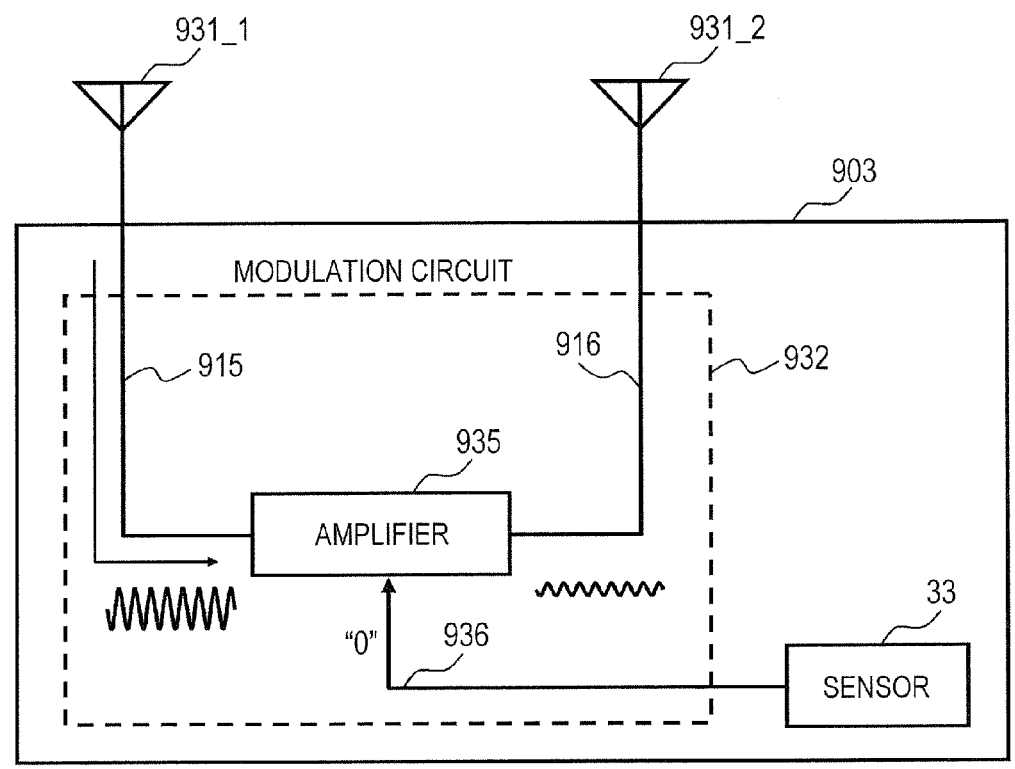
FIG. 20B is a diagram for explaining operation of the data transmitter shown in FIG. 19.

On the other hand, as shown in FIG. 20B, if second data which is an object for transmission is "0" (i.e., the gain control signal 936 is "0"), the amplifier 935 regulates the amplitude of the first signal 915 corresponding to the first radio wave 13 received by the receiving antenna 931_1 to a sufficiently small amplitude. Thus, in this case, because the second signal 916 with a sufficiently small amplitude is output from the amplifier 935, the second radio wave 14 that is output from the transmitting antenna 931_2 does not act as a disturbance to the first radio wave 12. In this way, data of "0" is transmitted from the data transmitter 903 to the second radio equipment 2. If the gain control signal 936 is "0", the amplifier 935 may regulate the amplitude of the first signal 915 corresponding to the first radio wave 13 received by the antenna 31 to zero. At this time, no second signal 916 is output from the amplifier 935 and, thus, no second radio wave 14 is output from the transmitting antenna 931_2.

Figure 21:
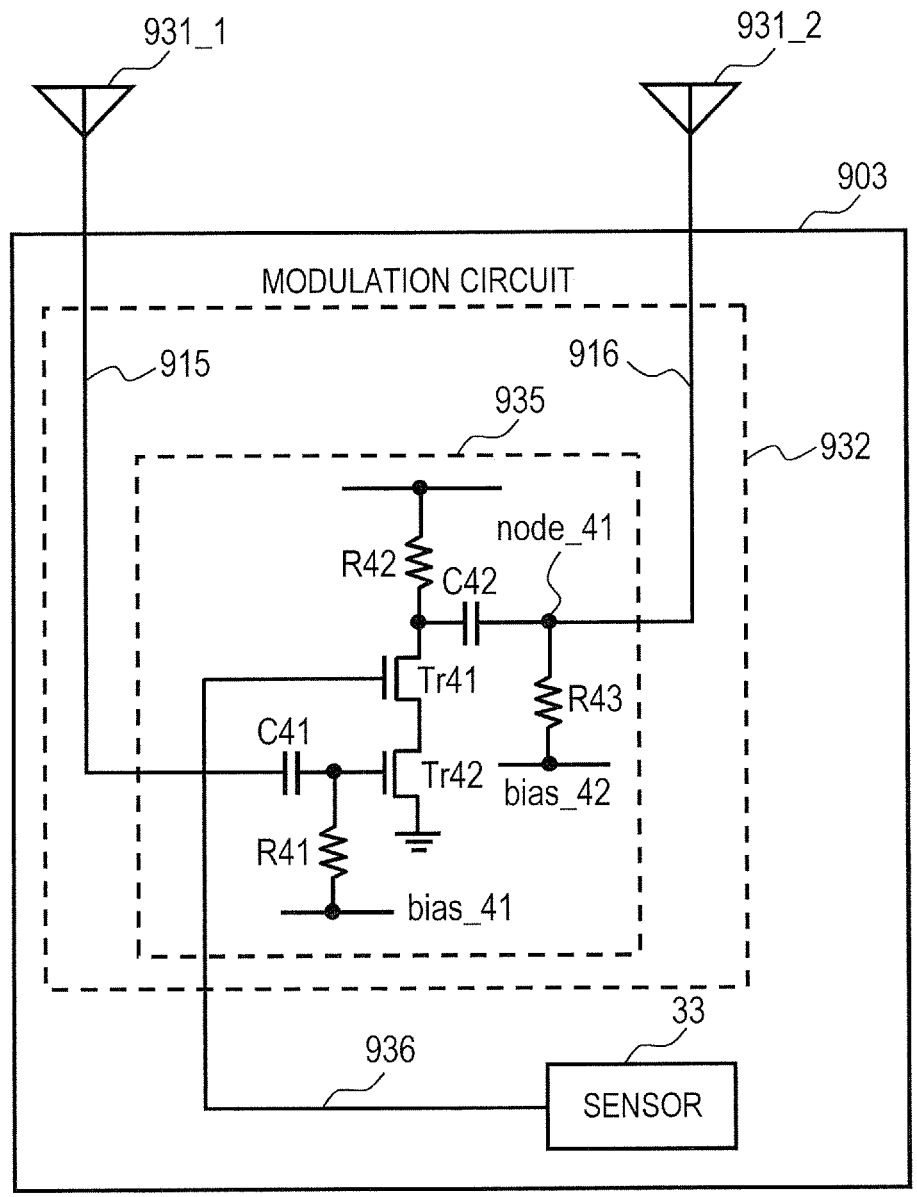
FIG. 21 is a circuit diagram showing a concrete example of the data transmitter shown in FIG. 19.

FIG. 21 is a circuit diagram showing a concrete example of the data transmitter 903 shown in FIG. 19. The data transmitter 903 shown in FIG. 21 is one example and, in the present embodiment, any data transmitter that can implement the operation described above can be used, not limited to the data transmitter shown in FIG. 21.

As shown in FIG. 21, the amplifier (single-end amplifier) 935 includes N-type transistors Tr41, T42, capacitors C41, C42, and resistors R41, R42, R43. The first signal 915 corresponding to the first radio wave 13 received by the receiving antenna 931_1 is supplied to one end of a capacitor C41. The other end of the capacitor C41 is coupled to one end of a resistor R41 and to a gate of an N-type transistor Tr42. A bias voltage bias_41 is supplied to the other end of the resistor R41. For the N-type transistor Tr42, its drain is coupled to a source of an N-type transistor Tr41 and its source is grounded.

For the N-type transistor Tr41, its gate is supplied with the gain control signal 936 and its drain is coupled to one end of a resistor R42 and to one end of a capacitor C42. The other end of the resistor R42 is coupled to a power supply VDD. The other end of the capacitor C42 is coupled to one end of a resistor R43. A bias voltage bias_42 is supplied to the other end of the resistor R43. The second signal 916 amplified by the amplifier 935 is output from a node node_41 at which the other end of the capacitor C42 and the one end of the resistor R43 are coupled and to the transmitting antenna 931_2.

In the amplifier 935 shown in FIG. 21, if the gain control signal 936 is "0", the N-type transistor Tr41 is put in an off state and, thus, no amplified signal is output from the node node_41. On the other hand, if the gain control signal 936 is "1", the N-type transistor Tr41 is put in an on state. At this time, the first signal 915 increased as much as the bias voltage bias_41 is supplied to the gate of the N-type transistor Tr42. Thereby, the N-type transistor Tr42 operates in response to the first signal 915 and, thus, the second signal 916 yielded by amplifying the first signal 915 is output from the node node_41. The amplified signal is supplied to the transmitting antenna 931_2 and radiated as the second radio wave 14 from the transmitting antenna 931_2.

By using the data transmitter 903 equipped with the amplifier 935 described above, it is possible to transmit second data from the data transmitter 903 to the second radio equipment 2 even if there is some distance between the data transmitter 903 and the second radio equipment 2. The data transmitter 903 pertaining to the present embodiment is also equipped with the receiving antenna 931_1 and the transmitting antenna 931_2. Thus, the duplexing element 37 used in the modulation circuit 32 of the first embodiment can be dispensed with. Besides, it is possible to prevent the oscillation of the amplifier 935.

Because the data transmitter 903 in the present embodiment is equipped with the receiving antenna 931_1 and the transmitting antenna 931_2, it is needed to avoid that the second radio wave 14 radiated from the transmitting antenna 931_2 is received by the receiving antenna 931_1 again. That is, if the second radio wave 14 radiated from the transmitting antenna 931_2 is received by the receiving antenna 931_1 again, a loop through the receiving antenna 931, amplifier 935, and transmitting antenna 931_2 is formed, and the modulation circuit 932 is at risk for oscillating.

Figure 22:
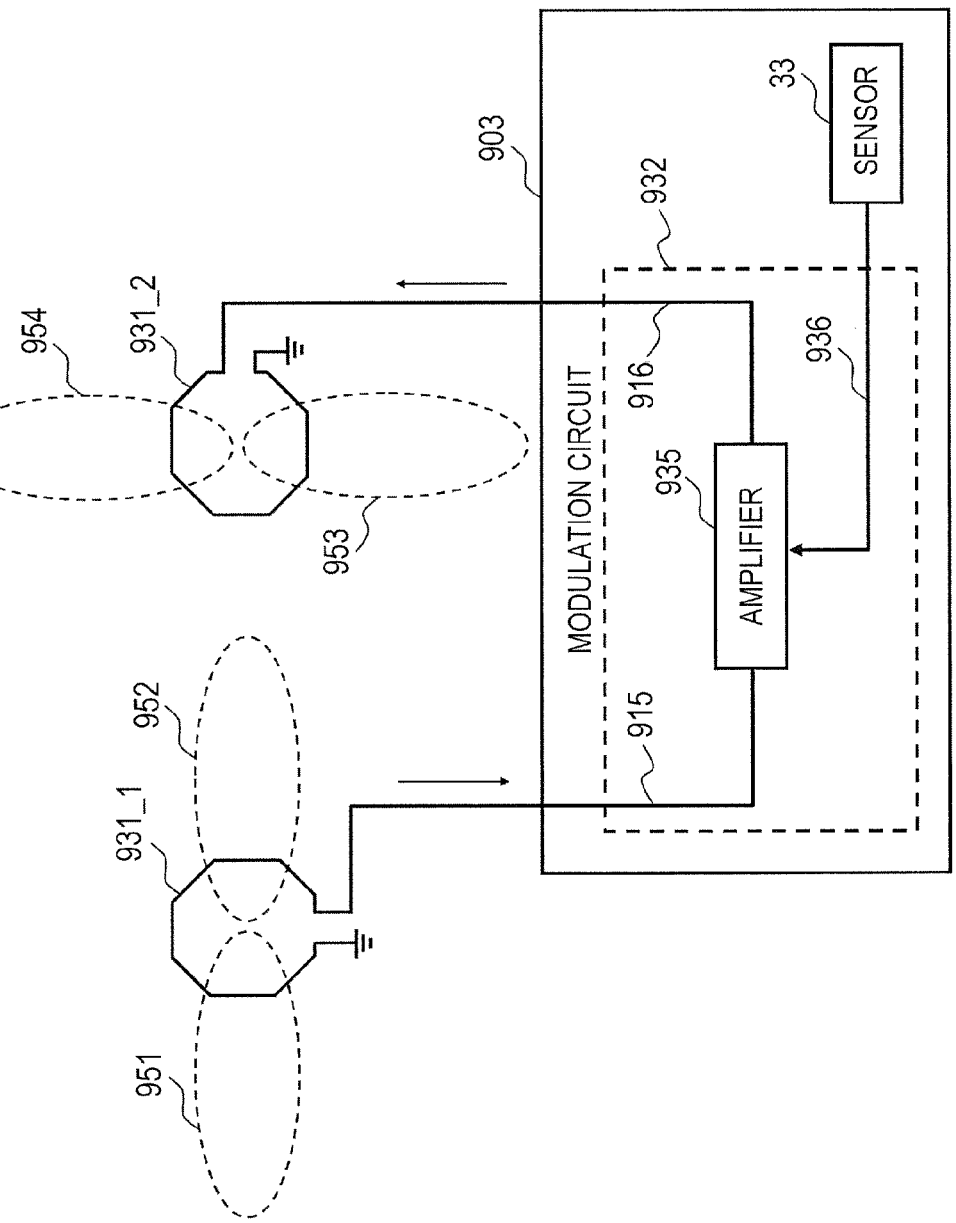
FIG. 22 is a diagram for explaining the arrangement of a receiving antenna and a transmitting antenna of the data transmitter shown in FIG. 19.

Therefore, in the present embodiment, the receiving antenna 931_1 and the transmitting antenna 931_2 of the data transmitter 903 should preferably be configured as shown in FIG. 22. That is, the receiving antenna 931_1 and the transmitting antenna 931_2 are configured as loop antennas and the receiving antenna 931_1 and the transmitting antenna 931_2 are arranged so as to be rotated 90 degrees relative to each other in the same plane. By arranging the receiving antenna 931_1 and the transmitting antenna 931_2 in this way, it can be avoided that the second radio wave 14 radiated from the transmitting antenna 931_2 is received by the receiving antenna 931_1 again. Shown in FIG. 22, reference numerals 951, 952 denote the spatial radiation characteristic of the receiving antenna 931_1 and reference numerals 953, 954 denote the spatial radiation characteristic of the transmitting antenna 931_2.

The invention pertaining to the present embodiment may appropriately be combined with the invention of any of the second through fifth embodiments described previously.

Seventh Embodiment

Figure 23:
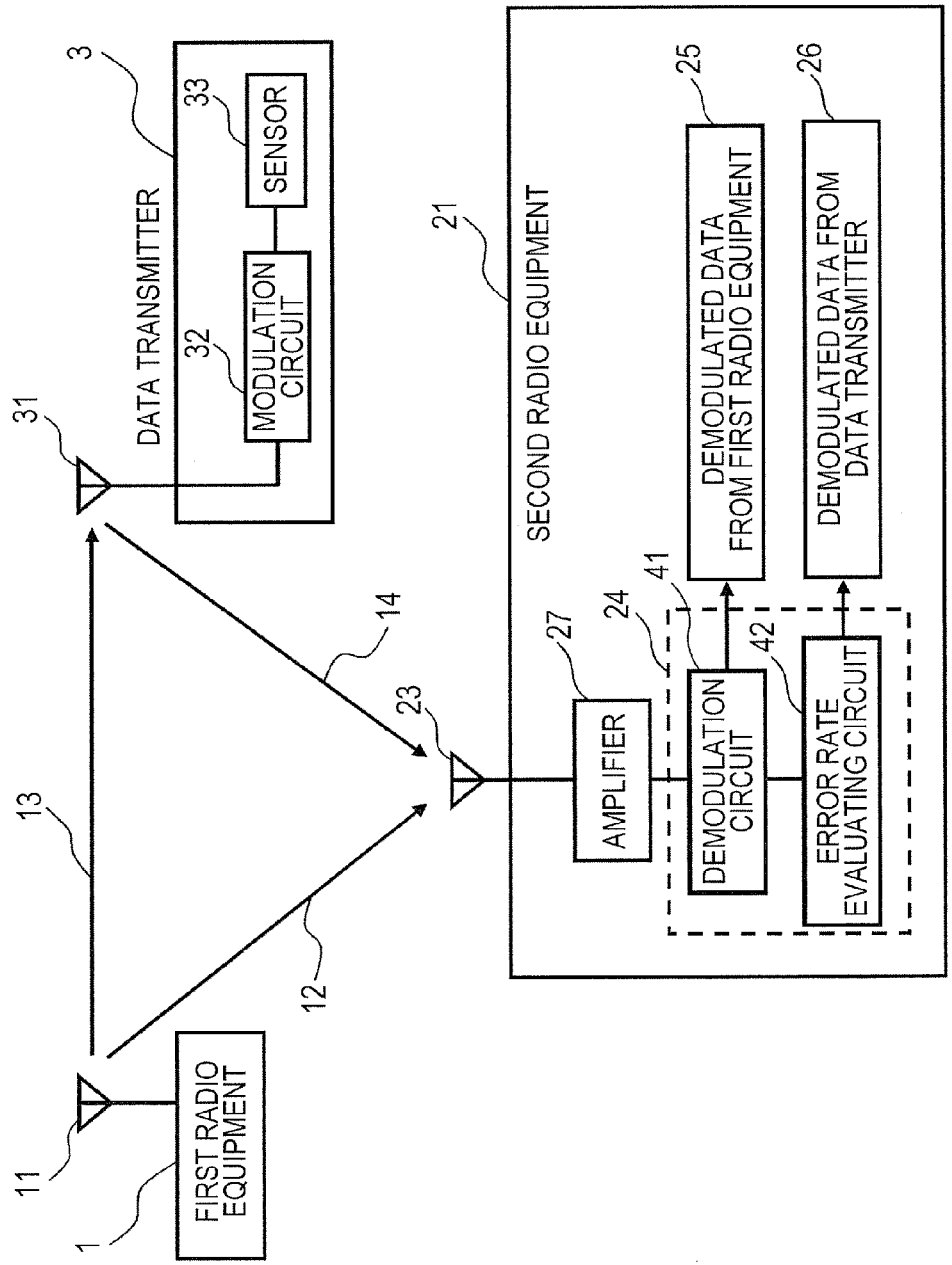
FIG. 23 is a block diagram representing a radio communication system pertaining to a seventh embodiment.

Next, a seventh embodiment of the present invention is described. FIG. 23 is a block diagram representing a radio communication system pertaining to the seventh embodiment. In the radio communication system pertaining to the present embodiment, the second radio equipment 21 includes a demodulation circuit 41 and an error rate evaluating circuit 42 as the separation and demodulation circuit 24, which differs from the radio communication system pertaining to the first embodiment described with FIG. 1. Because others are the same as in the first embodiment, the same components are assigned the same reference numerals and duplicative description is dispensed with.

As shown in FIG. 23, the second radio equipment 21 in the radio communication system pertaining to the present embodiment includes an amplifier 27, a demodulation circuit 41, and an error rate evaluating circuit 42. The amplifier 27 can be dispensed with, as appropriate, if the signal level of the first radio wave 12 and the second radio wave 14 is high, that is, at such a level that received radio wave signals can be processed by the following separation and demodulation circuit 24.

The demodulation circuit 41 demodulates first data transmitted from the first radio equipment 1 included in the received radio waves and outputs the demodulated data as demodulated data 25 from the first radio equipment 1. After the first data transmitted from the first radio equipment 1 has been demodulated, the error rate evaluating circuit 42 evaluates the bit error rate. Based on fluctuations in the bit error rate over time, the error rate evaluating circuit 42 reads and demodulates data from the data transmitter 3 and generates demodulated data 26 from the data transmitter 3. In the radio communication system pertaining to the present embodiment, a circuit that executes demodulation is only the demodulation circuit 41 that demodulates the first data transmitted from the first radio equipment 1. Data transmitted from the data transmitter 3 is demodulated in baseband processing in the following stage.

The received SN ratio for second data from the data transmitter 3 deteriorates, for example, in a case where an interfering wave from a third party has further come in the radio communication system configured as above, or in a case where the first radio wave (direct wave) 12 from the first radio equipment 1 is dominant over the second radio wave 14 from the data transmitter 3 because of their positional relation. In such a case, by carrying out decision by majority processing and code spreading, the received SN ratio for second data from the data transmitter 3 can be enhanced, so that the second radio equipment 21 can receive second data from the data transmitter 3.

For example, let us assume that the first radio equipment 1, the second radio equipment 21, and the data transmitter 3 are placed in the form of an isosceles triangle; i.e., a distance between the first radio equipment 1 and the second radio equipment 21 equals a distance between the first radio equipment 1 and the data transmitter 3 and a distance from the second radio equipment 21 to the data transmitter 3 is a half of the distance from the second radio equipment 21 to the first radio equipment 1. Also, let us assume an attenuation coefficient of about 0.5 for the second radio wave generated by modulating the radio wave from the first radio equipment 1 and radiated by the data transmitter 3 (here, the attenuation coefficient of the second radio wave is set low for the purpose of illustrating the case where the SN ratio of the signal transmitted from the data transmitter 3 deteriorates). In this case, the distance of an indirect travel of a radio wave from the first radio equipment 1 via the data transmitter to the second radio equipment 21 is 1.5 times the distance of a direct travel of a radio wave from the first radio equipment 1 to the second radio equipment 21. Assuming that the power of the arrived radio wave is proportional to a reciprocal of the square of the distance, the indirect wave is more attenuated by a distance attenuation of $10*\log(1/(1.5*1.5))=-4$ dB as compared with the direct wave. The indirect wave is further attenuated by $10*\log(0.5)=-3$ dB due to its attenuation coefficient of 0.5. Thereby, the ratio between the power N of the radio wave arrived as noise at the second radio equipment 21 directly from the first radio equipment 1 and the power S of the radio wave arrived as data at the second radio equipment 21 via the data transmitter 3 is $S/N=-3$ dB$+-4$ dB$=-7$ dB, assuming that signal attenuation=distance attenuation+modulation attenuation and the noise power is constant. In consequence, data is buried in noise.

Figure 26:
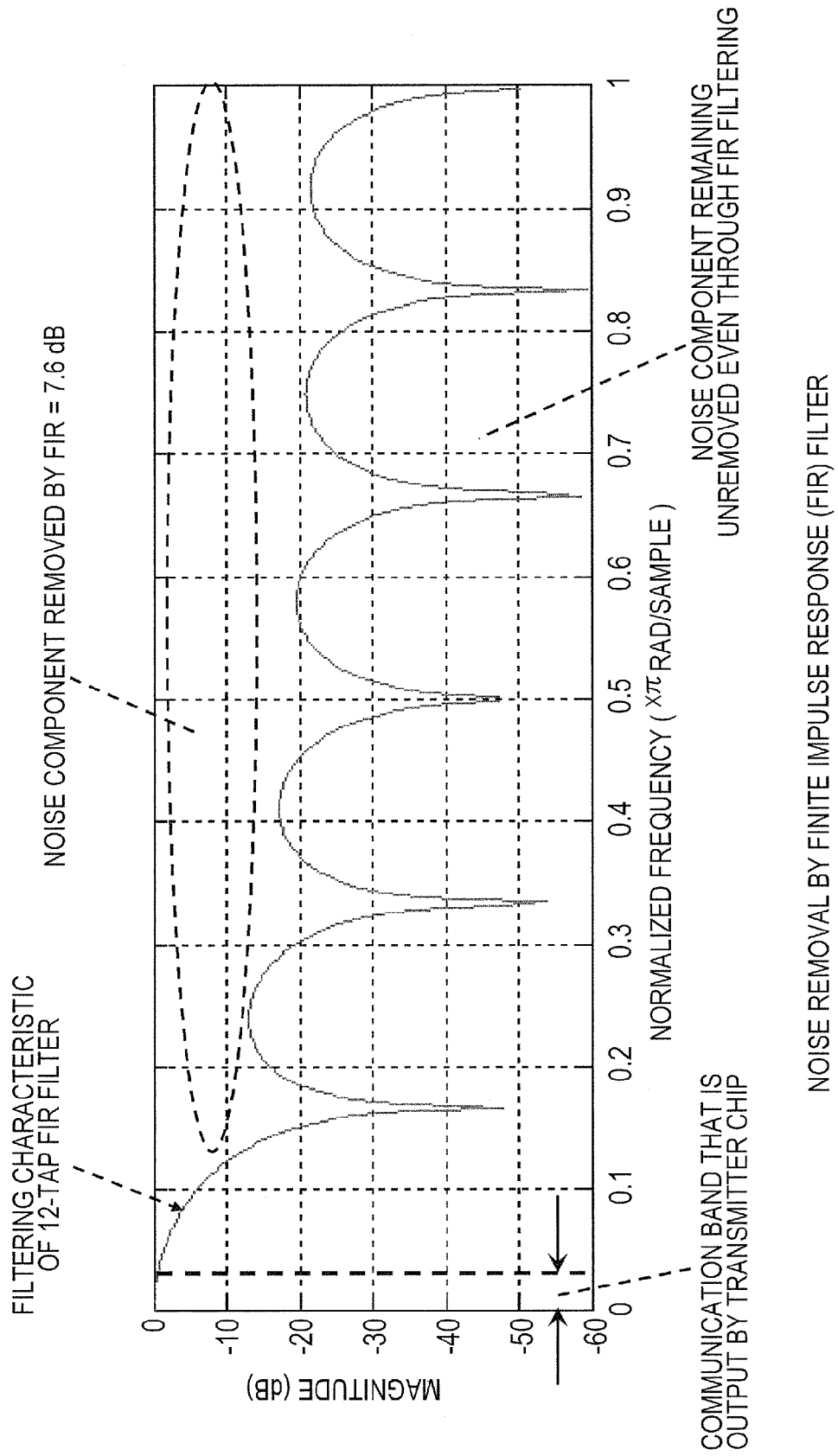
FIG. 26 is a diagram for explaining noise removal by a finite impulse response filter.

However, if, for example, same data is transmitted 12 times from the data transmitter 3 and decision by majority processing is performed at the second radio equipment 2 to suppress a random noise, the S/N ratio is improved 7.6 dB by filtering with a 12-tap finite impulse response filter, which is defined by $H(z^{-1})=1+z^{-1}+z^{-2}+\ldots+z^{-11}$, as shown in FIG. 26. Thus, it is possible to receive data with $S/N=-7$ dB.

Figure 27:
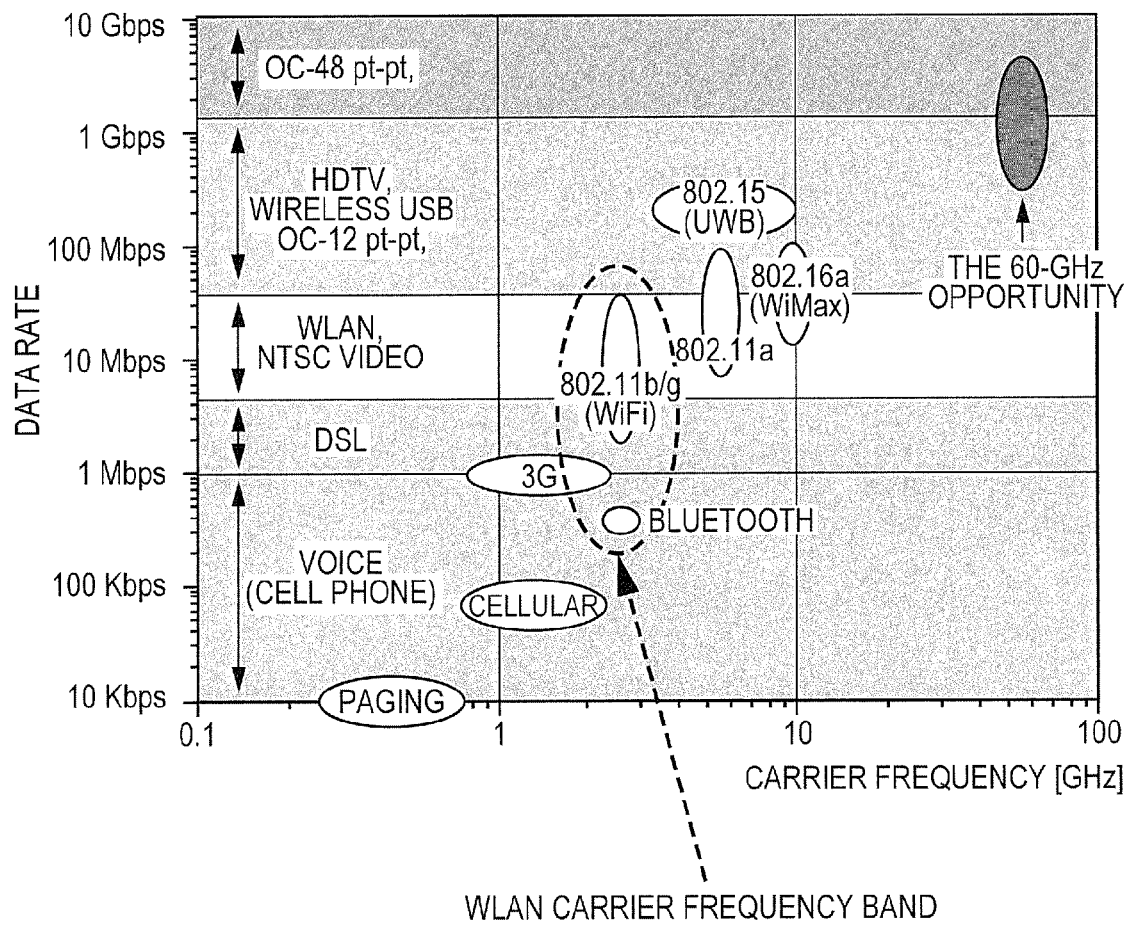
FIG. 27 is a diagram representing a relationship between carrier frequency and data rate of the radio communication system.

Here, as shown in FIG. 27, in a WLAN carrier frequency band of 2.4 GHz, the data rate is at least 1 Mbps or more. Thus, there is no periodicity at a low frequency for which the data rate is below 1 Mbps in environmental radio waves, white noise is considered to spread sufficiently over the communication band of the data transmitter 3. Therefore, it is possible to improve the SN ratio by carrying out the decision by majority processing. Because the decision by majority processing and code spreading require redundancy, the effective data communication rate decreases. In this case, data size that can be handled becomes smaller as compared with existing RFID systems.

Figure 24:
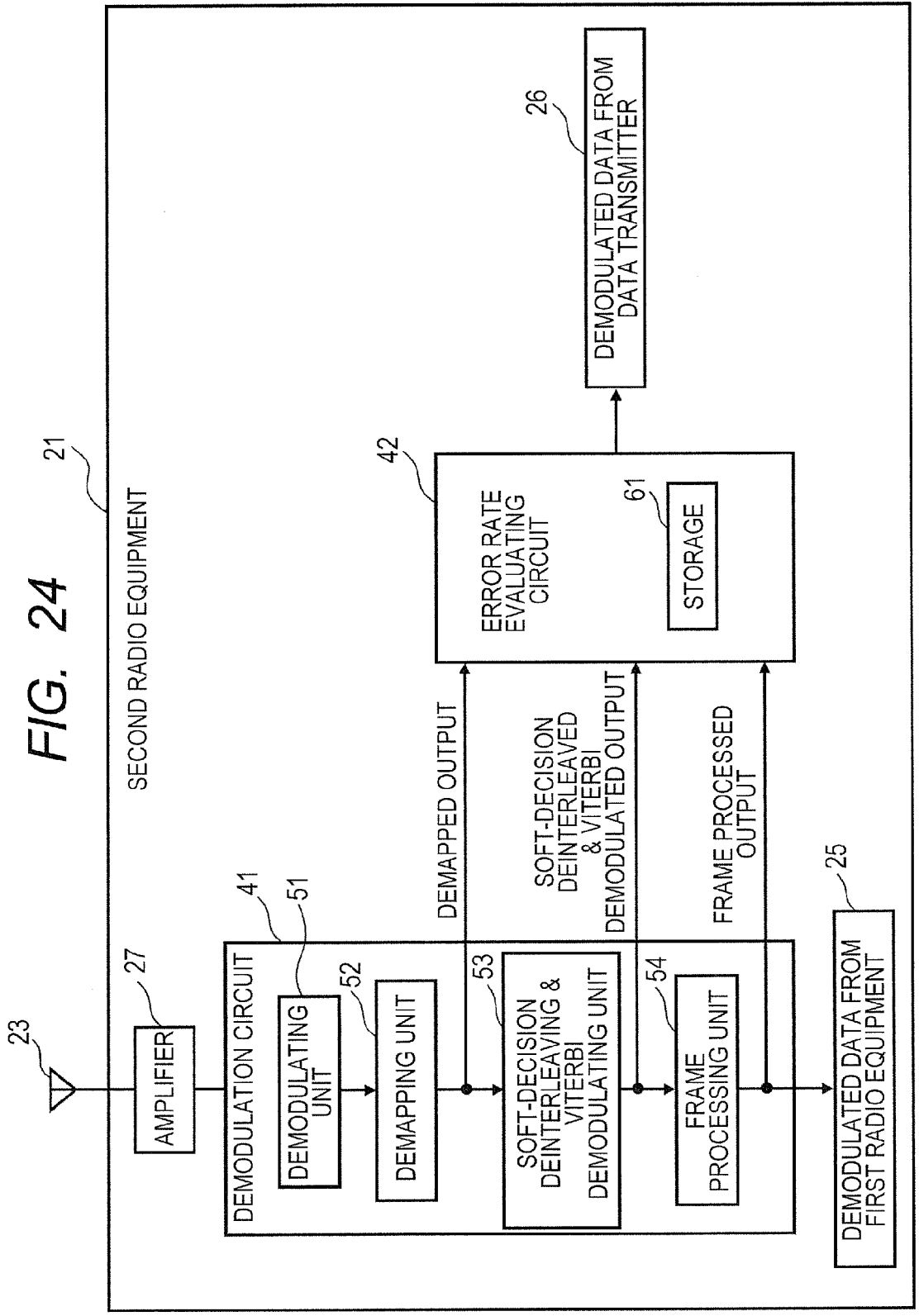
FIG. 24 is a block diagram representing a second radio equipment used in the radio communication system pertaining to the seventh embodiment.

Then, the second radio equipment 21 used in the radio communication system pertaining to the present embodiment is described specifically, using FIG. 24. The demodulation circuit 41 of the second radio equipment 21 shown in FIG. 24 includes a demodulating unit 51, a demapping unit 52, a soft-decision deinterleaving and Viterbi demodulating unit 53, and a frame processing unit 54.

A demapped output from the demapping unit 52 is output to the soft-decision deinterleaving and Viterbi demodulating unit 53 and the error rate evaluating circuit 42. A soft-decision deinterleaved and Viterbi demodulated output from the soft-decision deinterleaving and Viterbi demodulating unit 53 is output to the frame processing unit 54 and the error rate evaluating circuit 42. A frame processed output from the frame processing unit 54 is output as demodulated data 25 from the first radio equipment 1. The frame processed output from the frame processing unit 54 is also output to the error rate evaluating circuit 42.

The error rate evaluating circuit 42 also includes a storage 61. The error rate evaluating circuit 42 demodulates second data from the data transmitter 3 based on at least one of the demapped output, the soft-decision deinterleaved and Viterbi demodulated output, and the frame processed output and outputs demodulated data 26 from the data transmitter 3.

Figure 25:
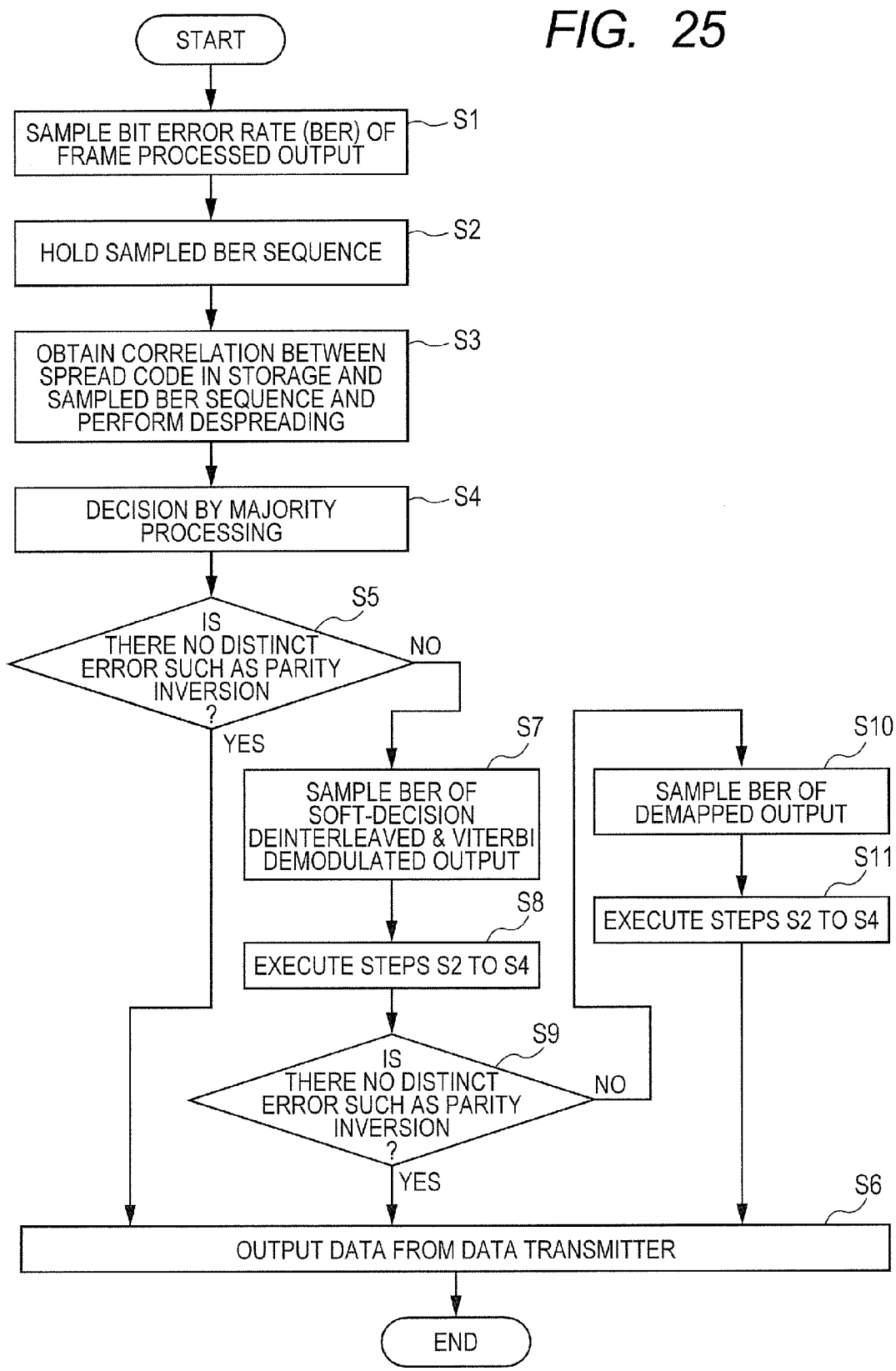
FIG. 25 is a flowchart for explaining operation of the radio communication system pertaining to the seventh embodiment.

FIG. 25 is a flowchart for explaining operation of the second radio equipment 21 shown in FIG. 24. First, first data transmitted from the first radio equipment 1 is demodulated by the demodulating unit 51. Data demodulated by the demodulating unit 51 is output from the demodulation circuit 41, diverging from each layer of protocol processing, such as a demapped bit sequence, a soft-decision deinterleaved and Viterbi demodulated bit sequence, and a frame processed bit sequence. As the demodulated data undergoes protocol processing in the demapping unit 52, further in the soft-decision deinterleaving and Viterbi demodulating unit 53, and further in the frame processing unit 54, the influence of a disturbance such as an interfering wave is alleviated. Therefore, the influence of a disturbance on a demapped bit sequence is larger than that on a frame processed bit sequence.

Then, sampling of bit error rate (BER) of the frame processed output is performed (step S1). This BER sampling is performed at a rate higher than the symbol rate of data transmitted from the data transmitter 3. The sampled BER sequence is held in the storage (step S2).

Then, code despreading is performed for the sequence obtained through the steps S1, S2 to improve the SN ratio (step S3). In particular, this step obtains a correlation between a spread code previously stored in the second radio equipment 21 and the sampled BER sequence and performs despreading. The resulting bit sequence is held again in the storage. Same data is repeatedly transmitted from the data transmitter 3. Thus, the decision by majority processing among such data is performed and the result is held in the storage (step S4).

Next, it is decided whether there is a distinct error such as parity bit inversion in the result obtained by the decision by majority processing (step S5). If there is no distinct error, as decided at step S5, the obtained result is output as data (second data) transmitted from the data transmitter 3 (step S6). Otherwise, if there is a distinct error, as decided at step S5, data from the data transmitter 3 is regarded as being transmitted in an environment in which the data tends to be buried in noise.

In such a case, sampling of BER of the soft-decision deinterleaved and Viterbi demodulated output that is more affected by a disturbance is performed (step S7). Then, the same processing as the above steps S2 to S4 is performed for a sampled BER sequence obtained from the soft-decision deinterleaved and Viterbi demodulated output (step S8). Further, it is decided whether there is a distinct error such as parity bit inversion in the result obtained by the decision by majority processing (step S9). If there is no distinct error, as decided at step S9, the obtained result is output as data (second data) transmitted from the data transmitter 3 (step S6).

Otherwise, if there is a distinct error, as decided at step S9, sampling of BER of the demapped output that is even more affected by a disturbance is performed (step S10). Then, the same processing as the above steps S2 to S4 is performed for a sampled BER sequence obtained from the demapped output (step S11). The thus obtained result is output as data (second data) transmitted from the data transmitter 3 (step S6).

As the object for BER sampling is changed from the frame processed output to the soft-decision deinterleaved and Viterbi demodulated output, and to the demapped output, the sensitivity to noise increases. In this case, the influence of noise can be reduced by increasing the length of the above spread code or increasing the number of times of sampling in the decision by majority processing. If the system is only used in a low noise environment, for example, in an environment where the distance between the data transmitter 3 and the second radio equipment 2 is short, it is not necessary to follow such a complex procedure as described above and it is possible to demodulate second data transmitted from the data transmitter 3 by tracing only the BER of the frame processed output.

In the radio communication system pertaining to the present embodiment as well, it is possible to provide a radio communication system capable of reducing the cost for introducing a system utilizing RFID technology into a radio network environment.

The second radio equipment 21 in the radio communication system pertaining to the present embodiment can also be configured by software implementation to customize existing radio equipment. That is, because demapping and subsequent processing in the second radio equipment 21 shown in FIG. 24 are protocol processing, the second radio equipment 21 shown in FIG. 24 can be configured by software implementation to customize the protocol processing unit, for example, shown in FIG. 9. In the present embodiment, a part of the protocol processing unit shown in FIG. 9 may be configured by hardware. In this case, the remaining part of the protocol processing unit other than the part configured by hardware is customized by software implementation. The second radio equipment 21 can also be configured in this way.

Eighth Embodiment

Next, an eighth embodiment of the present invention is described. In the radio communication system pertaining to the present embodiment, processing that is performed by the second radio equipment 21 shown in FIG. 24 differs from that in the seventh embodiment. Because others are the same as in the seventh embodiment and, the same components are assigned the same reference numerals and duplicative description is dispensed with.

Figure 28:
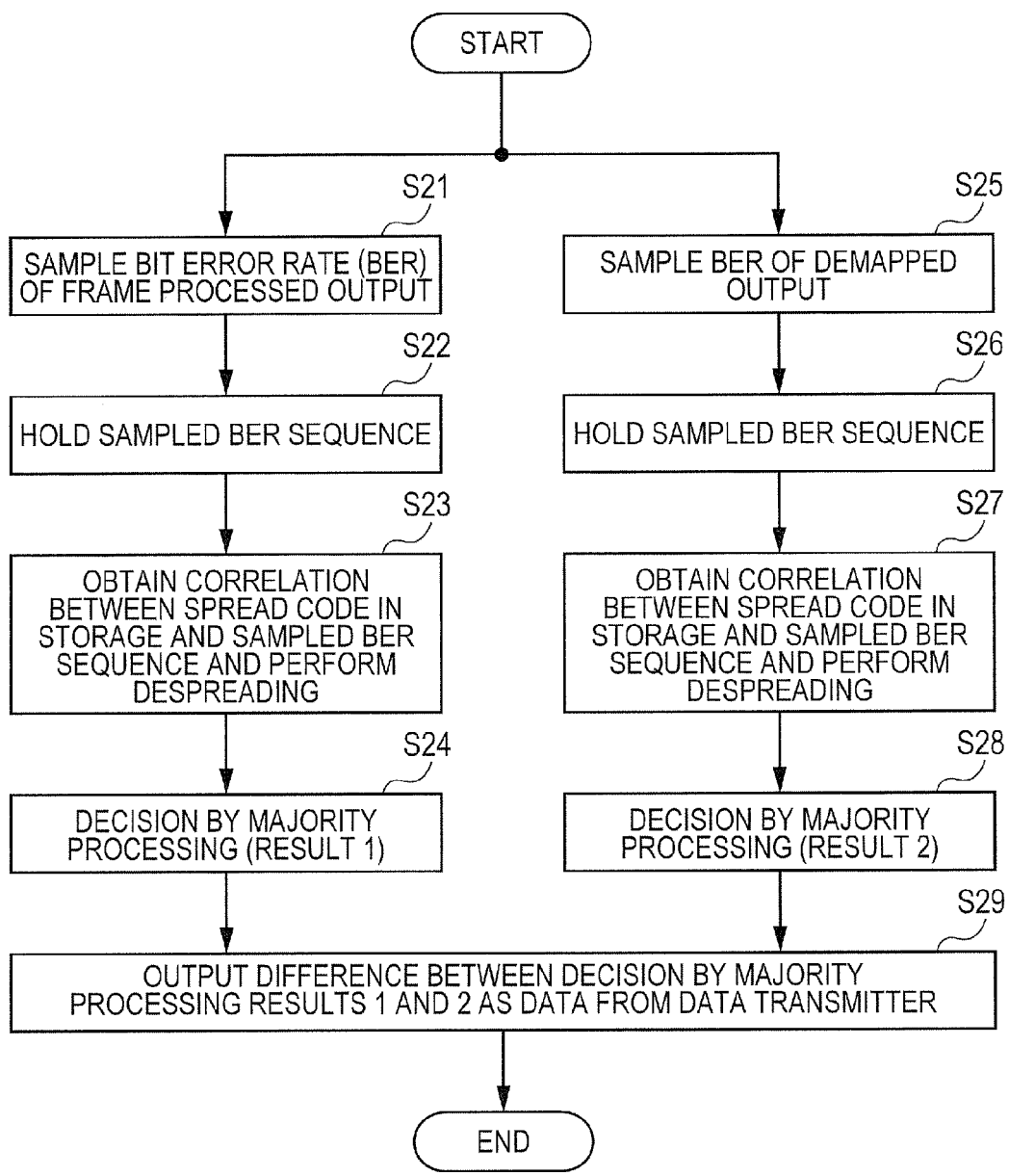
FIG. 28 is a flowchart for explaining operation of a radio communication system pertaining to an eighth embodiment.

FIG. 28 is a flowchart for explaining processing that is performed by the second radio equipment 21 pertaining to the present embodiment. A difference of the flowchart shown in FIG. 28 from the flowchart shown in FIG. 25 and described in the seventh embodiment lies in that the decisions by parity bit (S5, S9) are no longer needed.

Specifically, in the flowchart shown in FIG. 28, sampling of BER of the frame processed output is first performed (step S21). The sampled BER sequence is stored in the storage (step S22).

Then, code despreading is performed for the sequence obtained through the steps S21, S22 to improve the SN ratio (step S23). In particular, this step obtains a correlation between a spread code previously stored in the second radio equipment 21 and the sampled BER sequence and performs despreading. The resulting bit sequence is held again in the storage. Decision by majority processing is performed for data that is repeatedly transmitted from the data transmitter 3 and the result (result 1) is held in the storage (step S24).

In parallel with the processing from the above steps S1 to S24, the following processing is performed. First, sampling of BER of the demapped output is performed (step S25). The sampled BER sequence is held in the storage (step S26).

Then, code despreading is performed for the sequence obtained through the steps S25, S26 to improve the SN ratio (step S27). In particular, this step obtains a correlation between a spread code previously stored in the second radio equipment 21 and the sampled BER sequence and performs despreading. The resulting bit sequence is held again in the storage. Decision by majority processing is performed for data that is repeatedly transmitted from the data transmitter 3 and the result (result 2) is held in the storage (step S28).

Finally, a difference between the decision by majority processing results 1 and 2 is output as data (second data) transmitted from the data transmitter (step S29).

In this way, by obtaining a difference between the frame processed output that is less affected by a disturbance than the demapped output and the demapped output, it is possible to extract data transmitted as the disturbance from the data transmitter 3. In the radio communication system pertaining to the present, the processing that is performed by the second radio equipment 21 can be made simpler than that in the seventh embodiment.

Ninth Embodiment

Next, a ninth embodiment of the present invention is described. The radio communication system pertaining to the present embodiment includes a plurality of data transmitters 3_1 to 3_N, which differs from the radio communication systems described in the first through eighth embodiments. Because others are the same as in the first through eighth embodiments, the same components are assigned the same reference numerals and duplicative description is dispensed with.

Figure 29A:
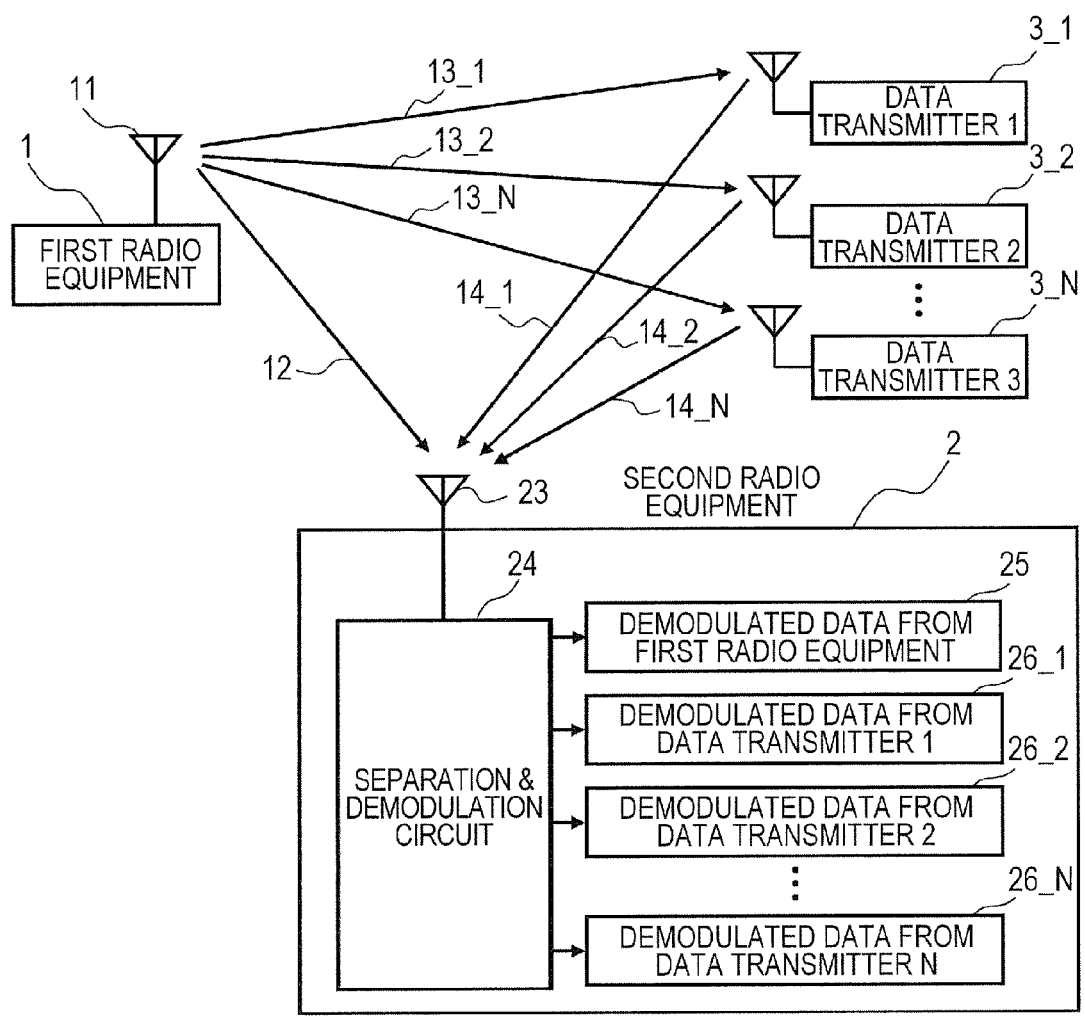
FIG. 29A is a block diagram representing a radio communication system pertaining to a ninth embodiment.

FIG. 29A is a block diagram representing the radio communication system pertaining to the present embodiment. As shown in FIG. 29A, the radio communication system pertaining to the present embodiment has a plurality of data transmitters 3_1 to 3_N within a receivable range of first radio waves output from the first radio equipment 1. A data transmitter 3_1 receives a first radio wave 13_1 output from the first radio equipment 1, modulates the first radio wave 13_1 depending on second data which is an object for transmission, and outputs a second radio wave 14_1. Similarly, a data transmitter 3_2 receives a first radio wave 13_2 output from the first radio equipment 1, modulates the first radio wave 13_2 depending on second data which is an object for transmission, and outputs a second radio wave 14_2. Similarly, a data transmitter 3_N receives a first radio wave 13_N output from the first radio equipment 1, modulates the first radio wave 13_N depending on second data which is an object for transmission, and outputs a second radio wave 14_N.

Figure 29B:
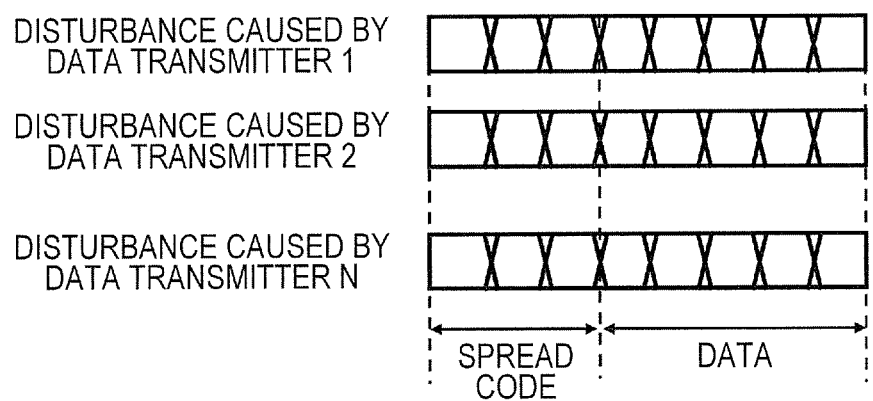
FIG. 29B is a diagram showing an example of disturbances to the first radio waves created by each of a plurality of data transmitters.

FIG. 29B is a diagram showing an example of disturbances to the first radio waves 13_1 to 13_N created by each of the data transmitters 3_1 to 3_N. As shown in FIG. 29B, each of the data transmitters 3_1 to 3_N adds identification information such as a spread code, as a header, to data which is an object for transmission.

The second radio equipment 2 receives the first radio wave 12 and the second radio waves 14_1 to 14_N and separates and demodulate first data transmitted from the first radio equipment 1 and each data transmitted from each of the data transmitters 3_1 to 3_N included in the received radio waves by means of the separation and demodulation circuit 24. Here, the separation and demodulation circuit 24 can distinguish each data transmitted from each data transmitter 3_1 to 3_N based on the identification information added as the header to the data which is an object for transmission. Data separated and demodulated by the separation and demodulation circuit 24 is output as demodulated data 25 from the first radio equipment 1 and demodulated data 26_1 to 26_N from each data transmitter 3_1 to 3_N.

Although a spread code is used as identification information in the above example, any identification information by which each data can be distinguished may be used. As the spread code, for example, an M-sequence code can be used. However, not limited to the M-sequence code, any pseudo random number code with a high autocorrelation, for example, a GOLD code can also be used. Although the examples in which despreading is performed have been described in the seventh and eighth embodiments, spreading for data identification needs to be done before such despreading in this case.

Figure 30:
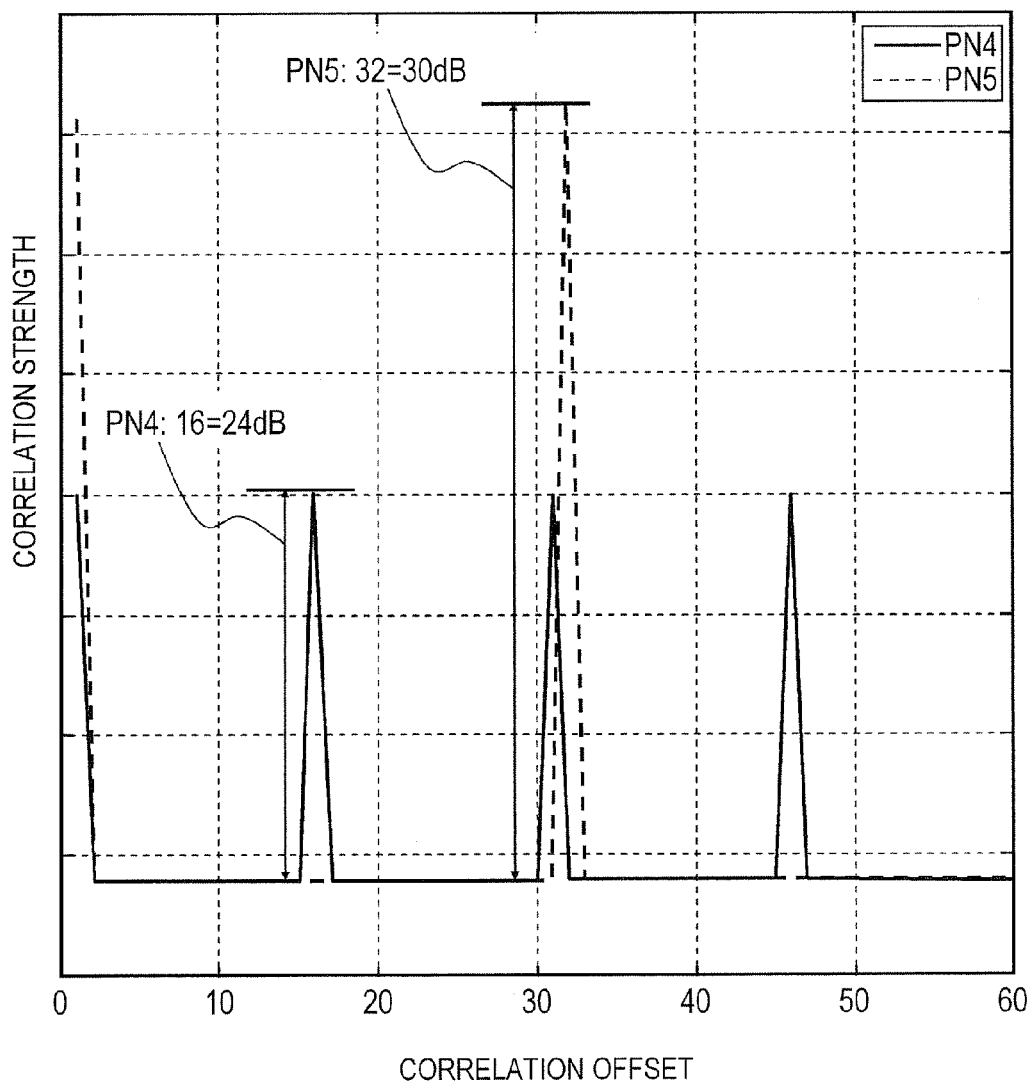
FIG. 30 is diagram representing SN ratio when M-sequence PN codes are used.

For example, assuming that a pseudo random number pattern which is a code sequence with a small autocorrelation, e.g., PN4 is used as the spread code, there is one pseudo random number sequence according to an initial value permitted for M sequences. However, if PN5 or PN7 is used, the pseudo random number sequences increase to three or nine, respectively. If autocorrelations of PN5 and PN7 each are profiled, as shown in FIG. 30, differences between the peak and bottom of correlation strength are 16 and 32, respectively, which correspond to 24 dB and 30 dB, respectively. Thus, data with such a spread code can be distinguished from data with another spread code at an accuracy higher than the SN ratio required for on/off keying modulation, where $BER>10^{-2}$.

If PN5 is used as the above header and matched filtering is initially performed when receiving data to synchronize a desired data transmitter with the second radio equipment 2, it is possible to selectively receive data only from a single desired data transmitter, even if three radio chips exist in the second radio equipment 2. If there are more than three data transmitters, it is possible to selectively receive data from each data transmitter by using a spread code of PN7 or higher.

By the radio communication system as described above, even in a case where a plurality of data transmitters 3_1 to 3_N exist, it is possible to avoid crosstalk and distinguish and receive each data transmitted from each data transmitter.

Tenth Embodiment

Next, a tenth embodiment of the present invention is described. In the tenth embodiment, a case is described in which the radio communication system described in any of the first through ninth embodiments is applied to an in-vehicle network of a motor vehicle.

Figure 31:
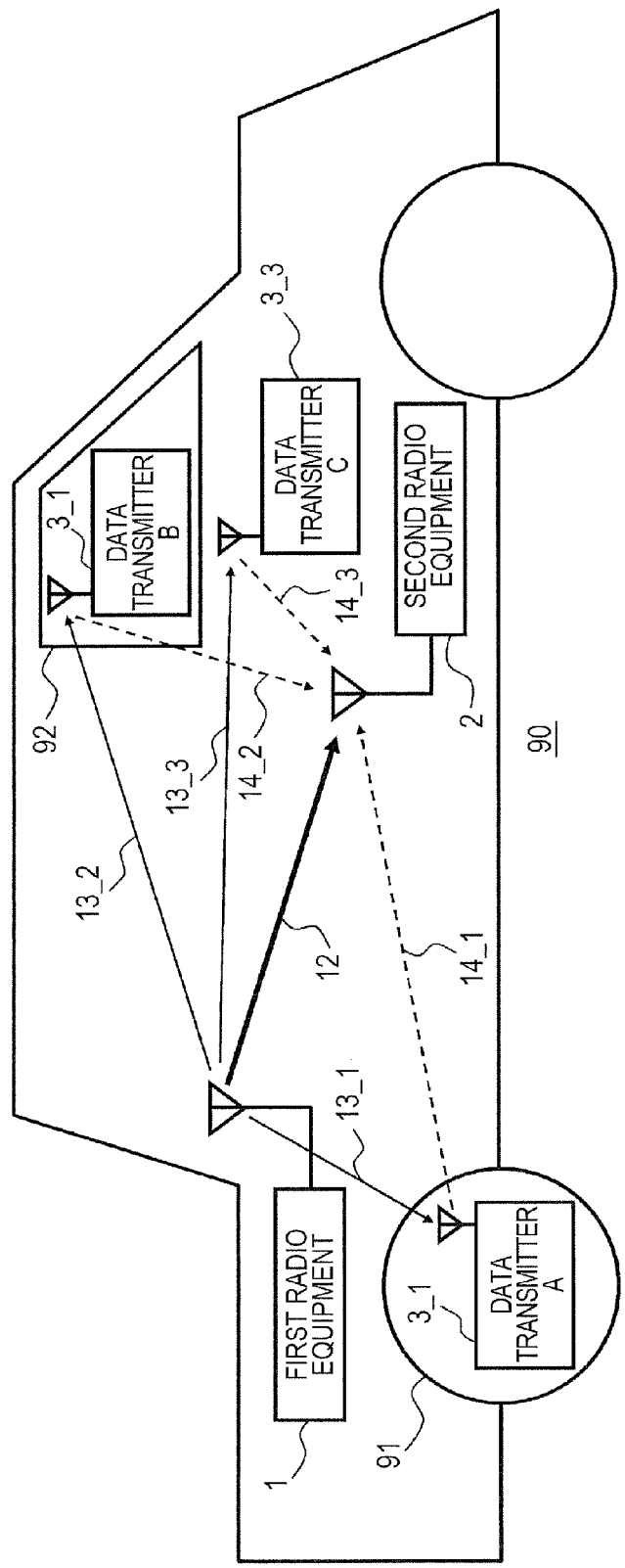
FIG. 31 is diagram for explaining an example in which the present invention is applied to an in-vehicle network.

In the present embodiment, as shown in FIG. 31, the in-vehicle network of a motor vehicle 90 is built using the first radio equipment 1 and the second radio equipment 2 described in any of the first through ninth embodiments. The first radio equipment 1 transmits first data to the second radio equipment 2, using a first radio wave 12. Here, the first radio wave 12 is a direct wave that is directly transmitted from the first radio equipment 1 to the second radio equipment 2.

For example, a system may be configured in which the first radio equipment 1 is connected to an ECU for engine control, an ECU for transmission control, an ECU for air-conditioner control, etc., and control information on these ECUs is transmitted by the first radio equipment 1 to the second radio equipment 2. For example, a system may be configured in which the second radio equipment 2 is connected to a car navigation system and control information transmitted from the first radio equipment 1 is displayed on the screen of the car navigation system.

The above examples are exemplary and any in-vehicle network may be built using the first radio equipment 1 and the second radio equipment 2 in the present embodiment.

In the present embodiment, a data transmitter 3 can be placed in any location in the motor vehicle. For example, a data transmitter A (3_1) may be placed on a tire 91 to monitor the air pressure of the tire 91 of the motor vehicle. This data transmitter A (3_1) may be equipped with a pressure sensor and may transmit information on the air pressure of the tire 91 acquired by the pressure sensor to the second radio equipment 2.

When air pressure information is transmitted from the data transmitter A (3_1) to the second radio equipment 2, the method described in any of the first through ninth embodiments can be used. That is, the data transmitter A (3_1) modulates the first radio wave 13_1 transmitted from the first radio equipment 1 depending on air pressure information which is an object for transmission and outputs the modulated radio wave as a second radio wave 14_1. The thus modulated second radio wave 14_1 acts as a disturbance to the first radio wave (direct wave) 12 transmitted from the first radio equipment 1 to the second radio equipment 2. Then, the second radio equipment 2 determines the presence or absence of a disturbance to the first radio wave 12, separates data transmitted from the first radio equipment 1 and air pressure information transmitted from the data transmitter A (3_1), and demodulates them.

For example, a data transmitter B (3_2) may be placed on a window 92 to monitor whether the window 92 of the motor vehicle is open or closed. This data transmitter B (3_2) may be equipped with a position sensor to detect whether the window 92 is open or closed and may transmit information as to whether the window 92 is open or closed, acquired by the position sensor, to the second radio equipment 2.

When information as to whether the window 92 is open or closed is transmitted from the data transmitter B (3_2) to the second radio equipment 2, the method described in any of the first through ninth embodiments can be used. That is, the data transmitter B (3_2) modulates the first radio wave 13_2 transmitted from the first radio equipment 1 depending on information as to whether the window 92 is open or closed, which is an object for transmission, and outputs the modulated radio wave as the second radio wave 14_2. Thus modulated second radio wave 14_2 acts as a disturbance to the first radio wave (direct wave) 12 transmitted from the first radio equipment 1 to the second radio equipment 2. Then, the second radio equipment 2 determines the presence or absence of a disturbance to the first radio wave 12, separates data transmitted from the first radio equipment 1 and information as to whether the window 92 is open or closed transmitted from the data transmitter B (3_2), and demodulates them.

For example, a data transmitter C (3_3) may be placed in any location in the motor vehicle to monitor in-vehicle temperature. This data transmitter C (3_3) may be equipped with a temperature sensor and may transmit information on in-vehicle temperature acquired by the temperature sensor to the second radio equipment 2.

When information on in-vehicle temperature is transmitted from the data transmitter C (3_3) to the second radio equipment 2, the method described in any of the first through ninth embodiments can be used. That is, the data transmitter C (3_3) modulates the first radio wave 13_3 transmitted from the first radio equipment 1 depending on information on in-vehicle temperature which is an object for transmission and outputs the modulated radio wave as the second radio wave 14_3. The thus modulated second radio wave 14_3 acts as a disturbance to the first radio wave (direct wave) 12 transmitted from the first radio equipment 1 to the second radio equipment 2. Then, the second radio equipment 2 determines the presence or absence of a disturbance to the first radio wave 12, separates data transmitted from the first radio equipment 1 and information on in-vehicle temperature transmitted from the data transmitter C (3_3), and demodulates them.

For example, when information indicative of abnormality has been transmitted from any of the data transmitters 3_1 to 3_3, the second radio equipment 2 can notify the driver of the abnormality by displaying an alert on the car navigation system connected to the second radio equipment 2.

The locations where the data transmitters 3 are placed, described above, are exemplary and the data transmitters 3 can be placed in any other locations. In such a case that a plurality of data transmitters 3 are placed, it is required to distinguish data transmitted from each data transmitter 3_1 to 3_3. In this case, for example, as described in the ninth embodiment, it is possible to distinguish the source of data transmitted from the data transmitter 3_1 to 3_3 by adding identification information such as a spread code as a header to data which is an object for transmission.

In the present embodiment, the data transmitters 3 are able to operate without being supplied with external power. Thus, the present invention is beneficial particularly in a case where the condition of a part in a location where power supply wiring is difficult is measured by a sensor, for example, the air pressure of a tire is measured.

Other Embodiments

Other embodiments are described below. The data transmitter described in any of the foregoing embodiments may be fabricated on a semiconductor chip. That is, all circuits (modulation circuit, sensor, etc.) constituting the data transmitter may be fabricated on a semiconductor chip. In this case, an antenna may be formed on the same semiconductor chip having the data transmitter's circuits formed thereon. Or an antenna may be formed separately from the semiconductor chip having the data transmitter's circuits formed thereon.

Figure 32A:
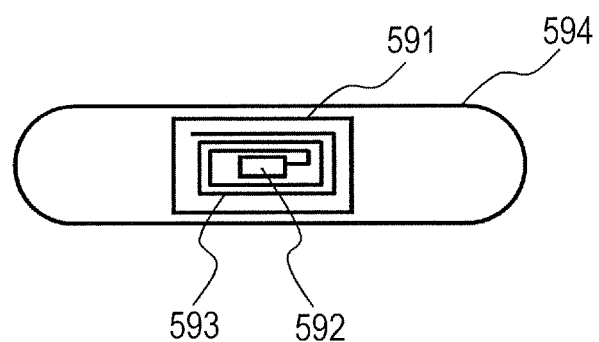
FIG. 32A is a diagram for explaining a data transmitter installed on an adhesive member.

As shown in FIG. 32A, a data transmitter 591 fabricated using a semiconductor chip can be attached to a measurement subject using an adhesive member 594. As the adhesive member 594, for example, adhesive tape can be used. Here, the data transmitter 591 includes all circuits 592 constituting the data transmitter and an antenna 593. For example, if the data transmitter 591 is equipped with a temperature sensor, it is possible to measure the temperature of a measurement subject easily by placing the chip of the data transmitter 591 on the adhesive member 594 and attaching the adhesive member 594 to the measurement subject.

Because the tack strength of the adhesive member deceases over time, the adhesive member cannot be used after a given time has elapsed. By contrast, the product lifetime of the data transmitter 591 is long. Therefore, the data transmitter 591 can be reused by configuring the adhesive member 594 so that the data transmitter 591 can be removed from it. For example, by forming a pocket on the adhesive member 594, the data transmitter 591 can be removed.

Figure 32B:
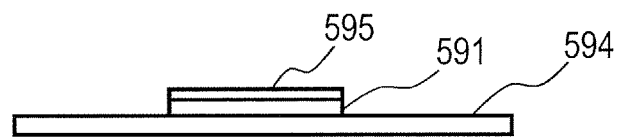
FIG. 32B is a cross-sectional view for explaining a data transmitter installed on an adhesive member.

FIG. 32B is cross-sectional view of an adhesive member. If the data transmitter 591 is equipped with a temperature sensor, as shown in FIG. 32B, as a member 595 that is positioned between the data transmitter 591 attached to the adhesive member 594 and the measurement subject, a material having a high thermal conductivity is preferably used. By using a material having a high thermal conductivity, it is possible to measure the temperature of the measurement subject accurately. As the material having a high thermal conductivity, inter alia, a metal material such as copper and a resin material having a high thermal conductivity can be used.

Also, a data transmitter may be installed to a thermometer. In this case, a temperature sensor that the thermometer has may be used as a sensor of the data transmitter. By installing the data transmitter to the thermometer, history data on the temperature of the measurement subject can be transmitted to the second radio equipment 2.

While the present invention has been described in accordance with the foregoing embodiments, it will be appreciated that the invention is not limited to only the configurations of the described embodiments and embraces variants, modifications, and combinations that can be achieved by those skilled in the art within the scope of the invention encompassed by the claims of the present application.

What is claimed is:

1. A radio communication system comprising:
   a first radio equipment that transmits first data as a first signal using a first radio wave;
   a data transmitter that outputs a second radio wave as a second signal generated by modulating the first radio wave depending on second data which is an object for transmission; and
   a second radio equipment that receives the first radio wave and the second radio wave and includes a separation and demodulation circuit that separates and demodulates the first data transmitted from the first radio equipment and the second data transmitted from the data transmitter included in the received radio waves,
   wherein the data transmitter comprises an amplifier for generating the second signal by amplifying the first signal corresponding to the first radio wave, depending on the second data, and outputs the second signal as the second radio wave.

2. The radio communication system according to claim 1, wherein, if a gain control signal corresponding to the second data is active, the amplifier amplifies the first signal amplitude so that the second radio wave acts as a disturbance to the first radio wave that is received by the second radio equipment.

3. The radio communication system according to claim 1, wherein the data transmitter further comprises:
   a signal antenna for receiving the first radio wave and transmitting the second radio wave; and
   a duplexing element that separates a path for transferring the first signal corresponding to the received first radio wave to an input of the amplifier and a path for transferring the second signal to be transmitted as the second radio wave from an output of the amplifier to the antenna.

4. The radio communication system according to claim 1, wherein the data transmitter further comprises:
   a receiving antenna for receiving the first radio wave; and
   a transmitting antenna for transmitting the second radio wave.

5. The radio communication system according to claim 4, wherein the receiving antenna and the transmitting antenna are configured as loop antennas and arranged so as to be rotated 90 degrees relative to each other in the same plane.

6. The radio communication system according to claim 1, wherein the amplifier comprises:
   a first amplifier that takes input of and amplifies the first signal;
   a second amplifier that further amplifies the first amplified signal output from the first amplifier and outputs the second signal; and
   a switch provided between the first amplifier and the second amplifier,
   wherein the amplifier generates the second signal by switching the switch between a conducting state and a non-conducting state depending on the second data.

7. The radio communication system according to claim 1, wherein the data transmitter further comprises:
   an attenuator that attenuates the amplified second signal and generates a third signal, which is the amplified second signal output from the amplifier fed back via the attenuator,
   wherein the amplifier receives input of the first signal and the third signal and generates the amplified second signal depending on the second data, and
   wherein an amount of attenuation by the attenuator is determined based on an amplitude of the first signal and an amplitude of the third signal.

8. The radio communication system according to claim 7, wherein the amplifier is configured as a differential amplifier that takes the respective inputs of the first signal and the third signal, and
   wherein an amount of attenuation by the attenuator is determined so that the amplitude of the first signal equals the amplitude of the third signal.

9. The radio communication system according to claim 1, wherein the amplifier is provided with an amplitude limiting function that limits the power level of the generated second signal below a prescribed value.

10. The radio communication system according to claim 1, wherein the amplifier includes a harmonic elimination circuit that eliminates harmonics generated when generating the second signal.

11. The radio communication system according to claim 1, wherein the data transmitter further comprises a sensor for acquiring the second data which is the object for transmission.

12. The radio communication system according to claim 1, wherein the data transmitter further comprises a data storage unit for storing the second data which is the object for transmission.

13. The radio communication system according to claim 1, wherein the data transmitter externally acquires the second data which is the object for transmission via an input terminal.

14. The radio communication system according to claim 1, wherein the data transmitter changes the bit error rate of the first radio wave by causing a disturbance to the first radio wave depending on the second data, and
   wherein the second radio equipment demodulates the second data transmitted from the data transmitter based on changes in the bit error rate of the first radio wave.

15. The radio communication system according to claim 14, wherein the data transmitter changes the bit error rate of the first radio wave within a range lower than a radio standard value of bit error rate.

16. The radio communication system according to claim 14, wherein a modulation cycle of bit error rate for transmitting the second data is longer than a modulation cycle of the first radio wave for transmitting the first data.

17. The radio communication system according to claim 1, wherein the radio communication system includes a plurality of data transmitters and the second radio equipment distinguishes the source of the second data based on respective identification information added to the second data by each of the data transmitters.

18. A radio communication method for transmitting second data by a radio transmitter over a radio network comprising a first radio equipment that transmits first data and a second radio equipment that receives the first data, the radio communication method comprising the steps of:
   transmitting the first data from the first radio equipment using a first radio wave;
   at the data transmitter, modulating the first radio wave depending on the second data, thus generating a second radio wave, and outputting the second radio wave; and at the second radio equipment, receiving the first radio wave and the second radio wave and separating and demodulating the first data transmitted from the first radio equipment and the second data transmitted from the data transmitter included in the received radio waves, wherein the step of generating and outputting the second radio wave at the data transmitter comprises amplifying a first signal corresponding to the first radio wave depending on the second data, thus generating a second signal, and outputting the second signal as the second radio wave.

19. The radio communication method according to claim 18, wherein, if a gain control signal corresponding to the second data is active, the amplifier amplifies the first signal amplitude so that the second radio wave acts as a disturbance to the first radio wave that is received by the second radio equipment.

20. A data transmitter comprising:

a modulation circuit that modulates a first radio wave being used in a radio network depending on transmission data which is an object for transmission, thereby generating a second radio wave that causes a disturbance to the first radio wave, wherein the modulation circuit comprises an amplifier for generating a second signal by amplifying a first signal corresponding to the first radio wave, depending on the transmission data, and outputs the second signal as the second radio wave.

21. The data transmitter according to claim 20, further comprising:

a signal antenna for receiving the first radio wave and transmitting the second radio wave; and a duplexing element that separates a path for transferring the first signal corresponding to the received first radio wave to an input of the amplifier and a path for transferring the second signal to be transmitted as the second radio wave from an output of the amplifier to the antenna.

22. The data transmitter according to claim 20, further comprising:

a receiving antenna for receiving the first radio wave; and a transmitting antenna for transmitting the second radio wave.

23. The data transmitter according to claim 22, wherein the receiving antenna and the transmitting antenna are configured as loop antennas and arranged so as to be rotated 90 degrees relative to each other in the same plane.

24. The data transmitter according to claim 20, wherein the amplifier comprises:

a first amplifier that takes input of and amplifies the first signal;

a second amplifier that further amplifies the first amplified signal output from the first amplifier and outputs the second signal; and a switch provided between the first amplifier and the second amplifier, wherein the amplifier generates the second signal by switching the switch between a conducting state and a non-conducting state depending on the transmission data.

25. The data transmitter according to claim 20, further comprising:

an attenuator that attenuates the amplified second signal and generates a third signal which is the amplified second signal output from the amplifier fed back via the attenuator, wherein the amplifier receives input of the first signal and the third signal and generates the amplified second signal depending on the transmission data, and wherein an amount of attenuation by the attenuator is determined based on an amplitude of the first signal and an amplitude of the third signal.

26. The data transmitter according to claim 25, wherein the amplifier is configured as a differential amplifier that takes the respective inputs of the first signal and the third signal, and wherein an amount of attenuation by the attenuator is determined so that the amplitude of the first signal equals the amplitude of the third signal.

27. The data transmitter according to claim 20, wherein the amplifier is provided with an amplitude limiting function that limits the power level of the generated second signal below a prescribed value.

28. The data transmitter according to claim 20, wherein the amplifier includes a harmonic elimination circuit that eliminates harmonics generated when generating the second signal.

29. The data transmitter according to claim 20, further comprising:

a sensor for acquiring the transmission data which is the object for transmission.

30. The data transmitter according to claim 20, further comprising:

a data storage unit for storing the transmission data which is the object for transmission.

31. The data transmitter according to claim 20, wherein the data transmitter externally acquires the transmission data which is the object for transmission via an input terminal.

* * * * *